(12) United States Patent
Uesugi et al.

(10) Patent No.: US 9,578,782 B2
(45) Date of Patent: Feb. 21, 2017

(54) HEAT DISSIPATION DEVICE, ELECTRONIC DEVICE, AND BASE STATION DEVICE

(71) Applicant: FUJITSU LIMITED, Kawasaki-shi, Kanagawa (JP)

(72) Inventors: Kenichi Uesugi, Yokohama (JP); Yoshihisa Nakagawa, Yokohama (JP); Atsushi Kaneko, Yokohama (JP); Hiroshi Nakamura, Kawasaki (JP); Hideki Sonobe, Yokosuka (JP); Toshimitsu Kobayashi, Otawara (JP)

(73) Assignee: FUJITSU LIMITED, Kawasaki (JP)

( * ) Notice: Subject to any disclaimer, the term of this patent is extended or adjusted under 35 U.S.C. 154(b) by 26 days.

(21) Appl. No.: 14/669,718

(22) Filed: Mar. 26, 2015

(65) Prior Publication Data
US 2015/0305200 A1 Oct. 22, 2015

(30) Foreign Application Priority Data
Apr. 17, 2014 (JP) .................................. 2014-085514

(51) Int. Cl.
*H05K 7/20* (2006.01)
(52) U.S. Cl.
CPC ....... *H05K 7/20409* (2013.01); *H05K 7/2069* (2013.01)
(58) Field of Classification Search
CPC .................................... H05K 7/20; H04B 1/40
USPC .......................... 361/714; 165/80.3; 455/561
See application file for complete search history.

(56) References Cited

U.S. PATENT DOCUMENTS

| D458,228 | S  | * | 6/2002 | Jacobson | ..................... D13/145 |
| 7,011,147 | B1 | * | 3/2006 | Hung | .................. F28D 15/0266 |
|  |  |  |  |  | 165/104.26 |
| 7,130,193 | B2 | * | 10/2006 | Hirafuji | ............. H05K 7/20445 |
|  |  |  |  |  | 165/104.33 |
| 7,450,382 | B1 | * | 11/2008 | Fischer | .............. H05K 7/20545 |
|  |  |  |  |  | 361/688 |
| 7,491,884 | B2 | * | 2/2009 | Schmidt | ................. H05K 5/061 |
|  |  |  |  |  | 174/564 |
| 7,515,423 | B2 | * | 4/2009 | Peng | .................. H05K 7/20936 |
|  |  |  |  |  | 165/104.21 |
| 7,813,128 | B2 | * | 10/2010 | Marchand | .......... H05K 7/20909 |
|  |  |  |  |  | 361/694 |
| 7,990,701 | B2 | * | 8/2011 | Yeh | ........................ G06F 1/182 |
|  |  |  |  |  | 165/121 |
| 2004/0085733 | A1 | * | 5/2004 | Leon | .................. H05K 7/20336 |
|  |  |  |  |  | 361/700 |

FOREIGN PATENT DOCUMENTS

| JP | 10-224068 A | 8/1998 |
| JP | 2001-156229 A | 6/2001 |
| JP | 2008-112870 A | 5/2008 |
| JP | 2009-164455 A | 7/2009 |

* cited by examiner

*Primary Examiner* — Dion R Ferguson
*Assistant Examiner* — Mandeep S Buttar
(74) *Attorney, Agent, or Firm* — Arent Fox LLP

(57) ABSTRACT

A heat dissipation device includes: a first plate with a first surface on which a first heat dissipation fin is formed; a second plate with a first surface on which a second heat dissipation fin is formed, and a heat conduction unit that passes through a first through-hole of the first plate and a second through-hole of the second plate.

12 Claims, 32 Drawing Sheets

HEAT DISSIPATION DEVICE, ELECTRONIC DEVICE, AND BASE STATION DEVICE

CROSS-REFERENCE TO RELATED APPLICATION

This application is based upon and claims the benefit of priority of the prior Japanese Patent Application No. 2014-085514 filed on Apr. 17, 2014, the entire contents of which are incorporated herein by reference.

FIELD

The embodiments discussed herein are related to a heat dissipation device, an electronic device, and a base station device.

BACKGROUND

Known is a housing with an outer circumferential surface on which multiple fins are provided.

Moreover, known is a plate-shaped heat sink in which multiple fins are provided on a surface of a block, and a hole is formed in the block and is filled with a working fluid.

In addition, known is a plate-shaped heat sink in which an insertion hole is formed in a body with a surface on which multiple fins are formed, and a heat pipe is inserted into the hole.

Moreover, known is a base station device including fins that are attached to a surface of a housing having a heat generating member inside.

For example, when a heat source is installed to the inner side of a housing including multiple side plates on which heat dissipation fins are formed, a side plate that comes into contact with the heat source and a side plate that does not come into contact with the heat source may be present in some cases when reduction in thickness of the housing is performed. In this case, the heat dissipation fins on the side plate that comes into contact with the heat source release a large amount of heat, whereas the heat dissipation fins on the side plate that does not come into contact with the heat source release a small amount of heat. In other words, although the heat dissipation fins are formed on the side plate that does not come into contact with the heat source, no sufficient heat dissipation effect is obtained because little heat is released from the side plate. As described above, the amount of heat dissipation from the heat dissipation fins varies for each side plate of the housing, thereby lowering the heat dissipation efficiency.

In addition, the conventional plate-shaped heat sinks are capable of conducting the heat only in one direction of the vertical direction or the lateral direction. For this reason, as for the housing including multiple side plates, it has been difficult to transfer heat in two directions of a direction between the side plates (the lateral direction) and the vertical direction.

The following are reference documents.
[Document 1] Japanese Laid-open Patent Publications No. 2009-164455,
[Document 2] Japanese Laid-open Patent Publications No. 2001-156229,
[Document 3] Japanese Laid-open Patent Publications No. 10-224068, and
[Document 4] Japanese Laid-open Patent Publications No. 2008-112870.

SUMMARY

According to an aspect of the invention, a heat dissipation device includes: a first plate with a first surface on which a first heat dissipation fin is formed; a second plate with a first surface on which a second heat dissipation fin is formed, and a heat conduction unit that passes through a first through-hole of the first plate and a second through-hole of the second plate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments discussed herein will be described.

First Embodiment

Base Station Device 10

A base station device 10 according to a first embodiment will be described. The base station device 10 is, for example, a device that is installed outdoors as a base station for a mobile communication device such as a mobile telephone. Further, the base station device 10 may be installed indoors.

Figure 1:
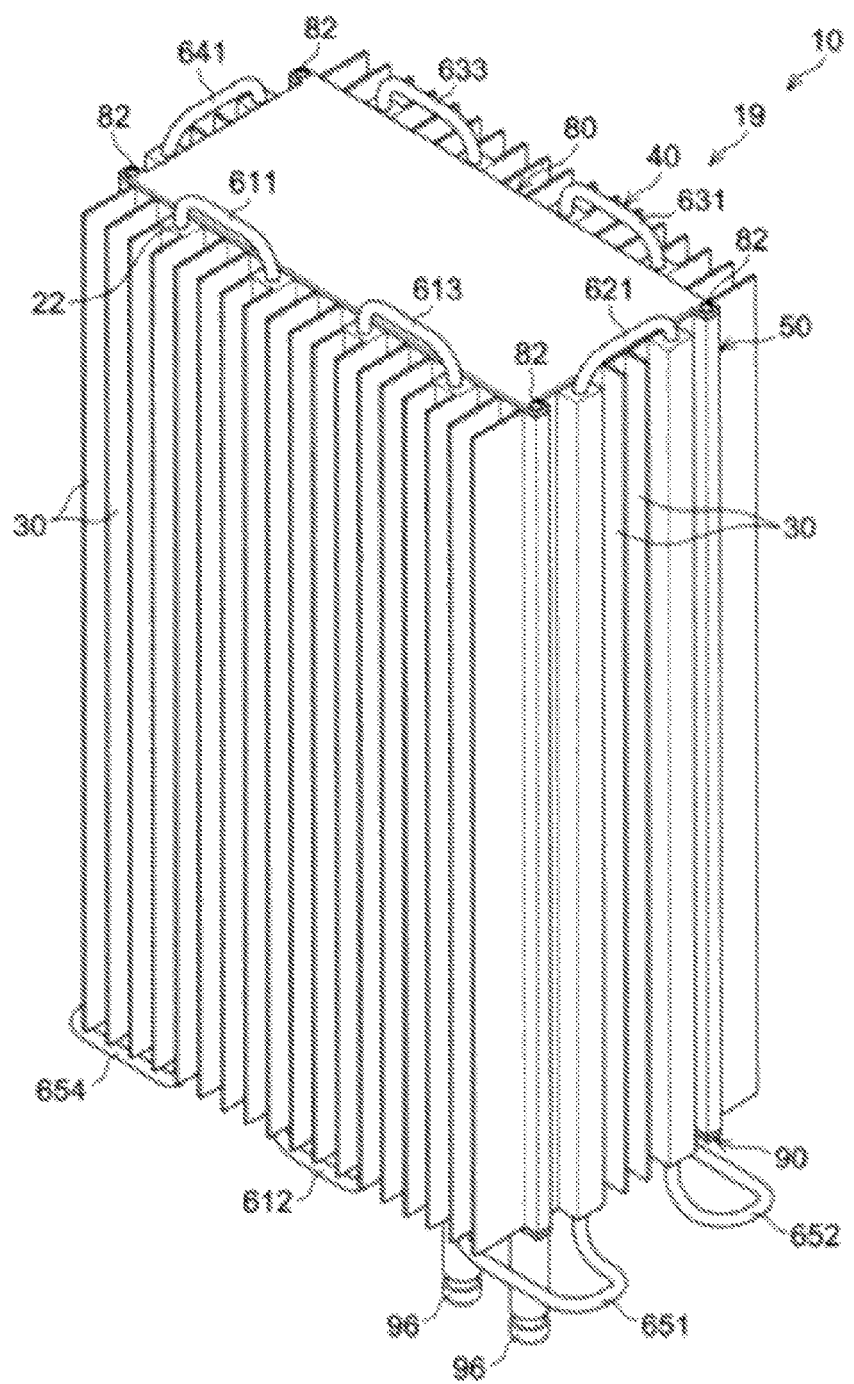
FIG. 1 is a perspective view of a base station device according to a first embodiment.
Figure 2:
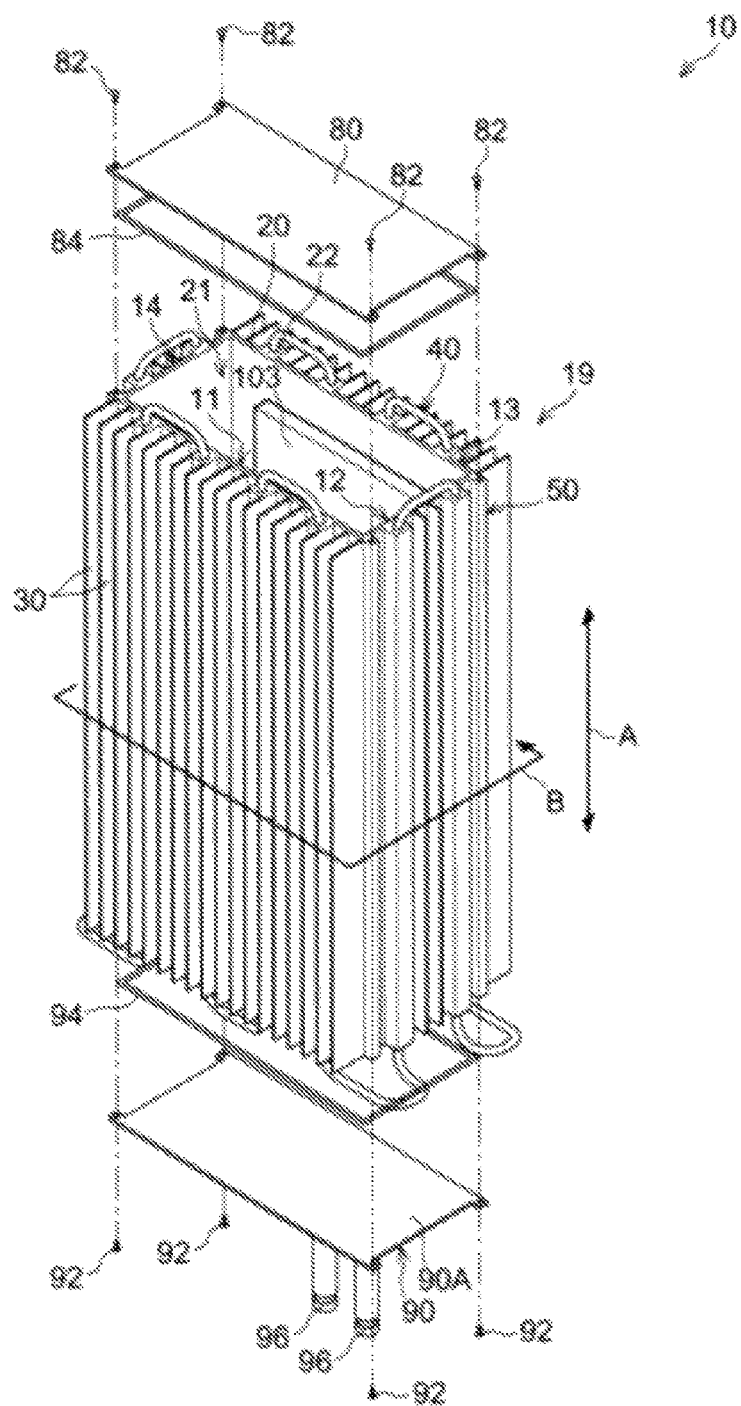
FIG. 2 is an exploded perspective view of the base station device according to the first embodiment.
Figure 3:
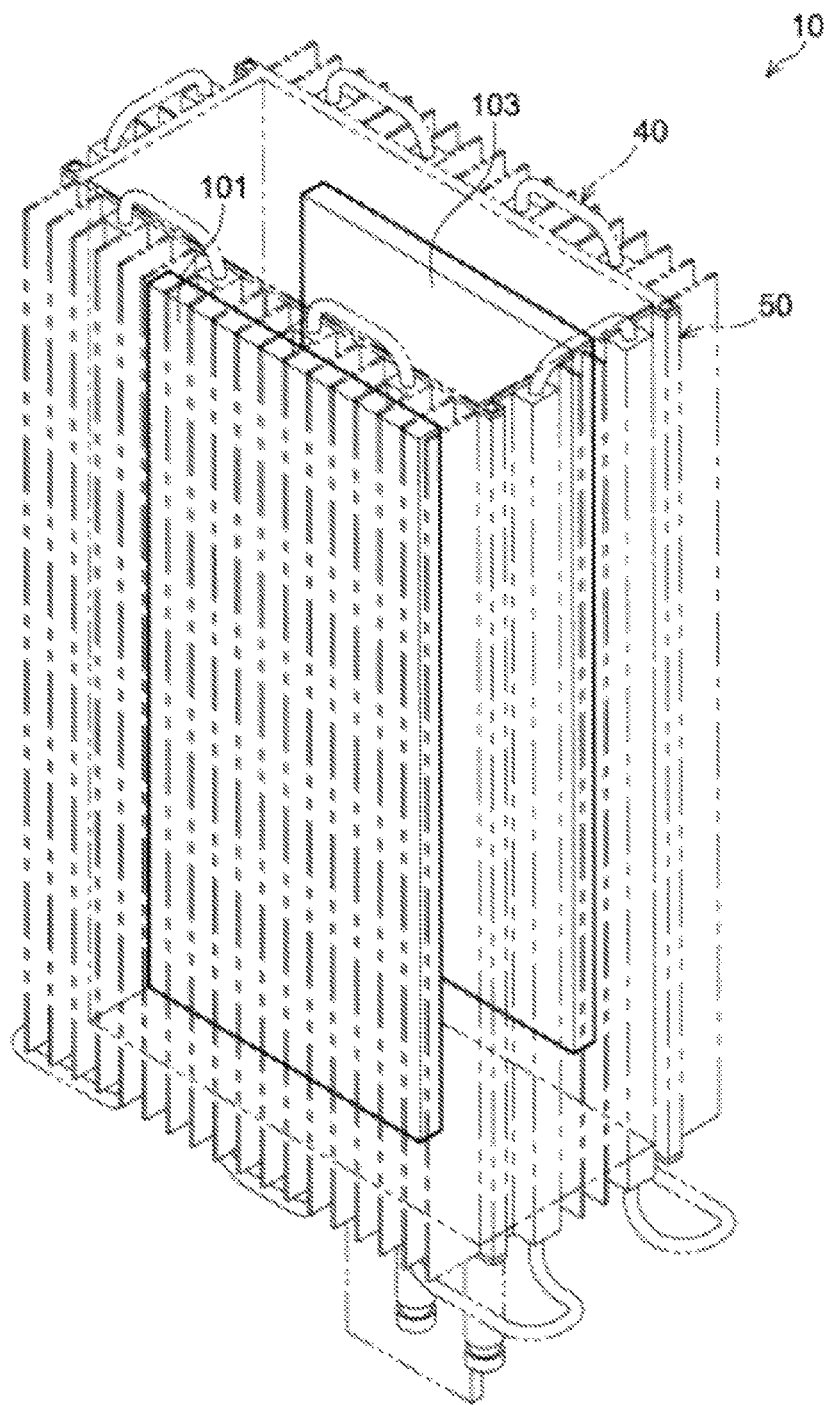
FIG. 3 is a perspective view seen through the interior of the base station device according to the first embodiment.
Figure 4:
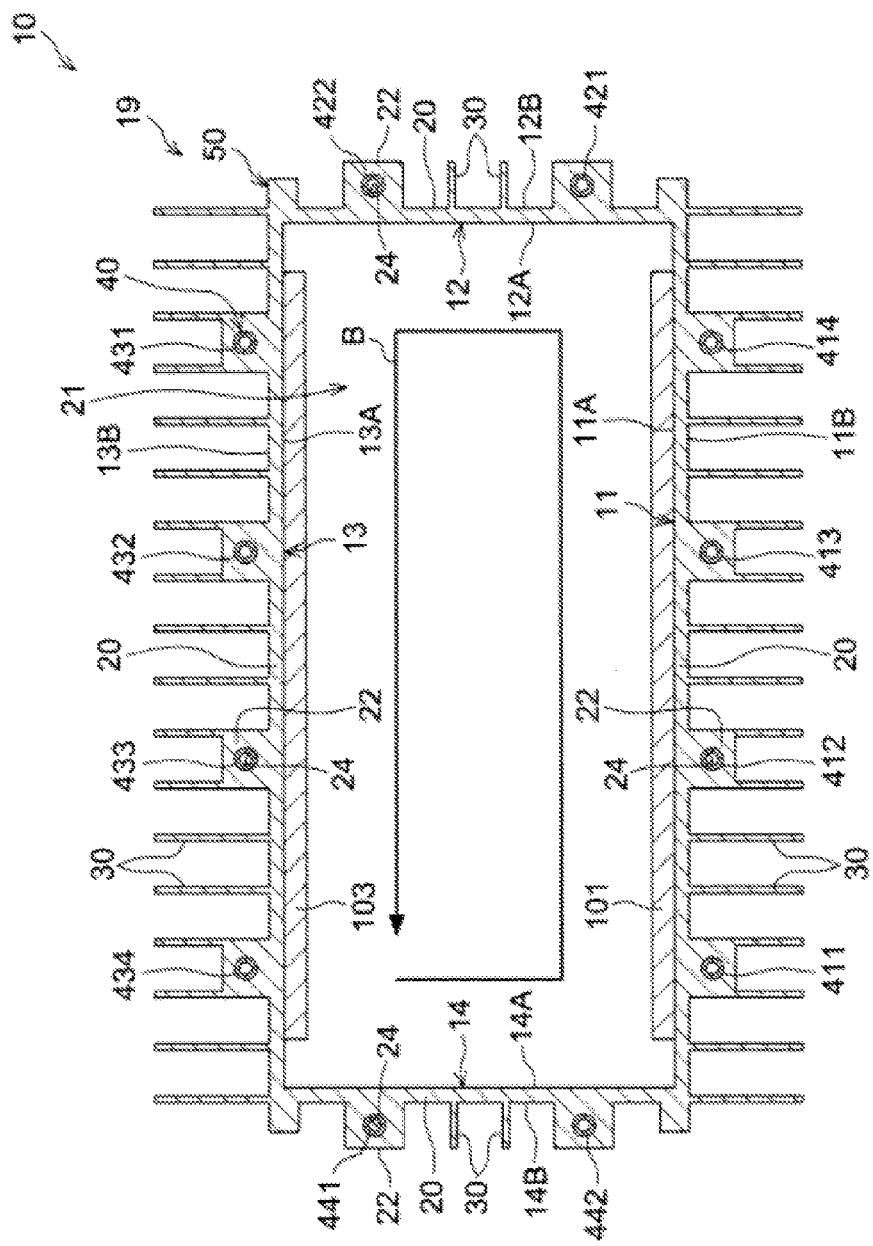
FIG. 4 is a cross-sectional plan view of the base station device according to the first embodiment.

Specifically, the base station device 10 is provided with, as illustrated in FIG. 1 and FIG. 2, a tubular housing 50, a heat pipe 40 (see FIG. 6) that is provided in the housing 50, and plate-shaped lids 80 and 90 (see FIG. 2) that are respectively provided above and below the housing 50. In addition, the base station device 10 includes, as illustrated in FIG. 3 and FIG. 4, circuit boards 101 and 103 (an example of a heat source, an example of a heat-generating element) that are disposed inside the housing 50. The circuit boards 101 and 103 include heat-generating elements (electronic components), and thus generate heat. The base station device 10 may include either one of the circuit boards 101 and 103.

In the base station device 10, the housing 50 and the heat pipe 40 release heat generated from the circuit boards 101 and 103. In other words, the base station device 10 is provided with, as illustrated in FIG. 1 and FIG. 2, a heat dissipation device (heat dissipation structure) 19 that includes the housing 50 and the heat pipe 40. Hereinafter, specific structures of the housing 50, the heat pipe 40, and the lids 80 and 90 will be described.

Housing 50

The housing 50 includes, as illustrated in FIG. 2 and FIG. 4, a first side plate 11 (an example of a first plate), a second side plate 12 (an example of a second plate), a third side plate 13 (an example of the first plate or a third plate), and a fourth side plate 14 (an example of the second plate or a fourth plate). Hereinafter, the first side plate 11, the second side plate 12, the third side plate 13, and the fourth side plate 14 are collectively indicated as side plates 11 to 14.

The side plates 11 to 14 form a peripheral wall (side wall) of the housing 50. Specifically, the second side plate 12 is a side plate adjacent to the first side plate 11. The third side plate 13 is a side plate adjacent to the second side plate 12 and opposed to the first side plate 11. The fourth side plate 14 is a side plate adjacent to the third side plate 13 and the first side plate 11, and opposed to the second side plate 12. The peripheral wall of the housing 50 is tubular with a rectangular cross-section in which the first side plate 11 and the third side plate 13 are longer than the other plates.

As illustrated in FIG. 4, each of the side plates 11 to 14 includes a base plate 20, and projection sections 22 that are provided in plurality with intervals on an outer surface of the base plate 20.

The projection sections 22 protrude outward from the outer surface of the base plate 20. The projection sections 22 are provided to be extended along an axial direction of the housing 50 (see A direction in FIG. 2). Moreover, the projection sections 22 are disposed in plurality with intervals to the side plates 11 to 14 along the circumferential direction of the housing 50 (B direction in FIG. 2 and FIG. 3). Four projection sections 22, for example, are respectively disposed to the first side plate 11 and the third side plate 13. Two projection sections 22, for example, are respectively disposed to the second side plate 12 and the fourth side plate 14.

Insertion holes 24 into which the heat pipe 40 is to be inserted are formed in the projection sections 22. The insertion hole 24 penetrates through the projection section 22 along the axial direction of the housing 50.

A space at an inner circumference side of the housing 50 is a housing space 21 in which the circuit boards 101 and 103 (an example of a heat source) are housed. Specifically, as illustrated in FIG. 4, the circuit boards 101 and 103 are respectively attached to an inner surface 11A of the first side plate 11 (a surface at the inner side of the housing 50, the same applies hereinafter) and an inner surface 13A of the third side plate 13. This causes the circuit boards 101 and 103 to respectively come into contact with the inner surface 11A of the first side plate 11 and the inner surface 13A of the third side plate 13, whereby heat generated from the circuit board 101 and heat generated from the circuit board 103 are respectively conducted to the first side plate 11 and the third side plate 13. Further, each of the inner surfaces 11A, 12A, 13A, and 14A of the side plates 11 to 14 is formed in a planar shape.

Multiple heat dissipation fins 30 are formed on an outer circumferential surface of the housing 50. Specifically, the heat dissipation fins 30 are formed on outer surfaces 11B, 12B, 13B, and 14B of the side plates 11 to 14 (outer surfaces at the outer side of the housing 50, the same applies hereinafter). Each of the heat dissipation fins 30 is formed along the axial direction of the housing 50. The multiple heat dissipation fins 30 are disposed along the circumferential direction of the housing 50. The multiple heat dissipation fins 30 are integrally formed with the base plates 20 and the projection sections 22 described above.

Further, the housing 50 is formed by extrusion molding, for example. The housing 50 is formed of a metal material such as aluminum, for example.

Lids 80 and 90

As illustrated in FIG. 2, a lid 80 is attached to an upper end portion of the housing 50. Four corners of the lid 80 are fastened to the upper end portion of the housing 50 with fastening members 82 such as screws, for example, so that the lid 80 is fixed to the housing 50. A sealing member (gasket) 84 is interposed into a part between the lid 80 and the upper end portion of the housing 50. This seals the part between the lid 80 and the upper end portion of the housing 50. Sealing the part between the lid 80 and the upper end portion of the housing 50 restricts rainwater or dust to enter into the upper end portion of the housing 50.

Figure 5:
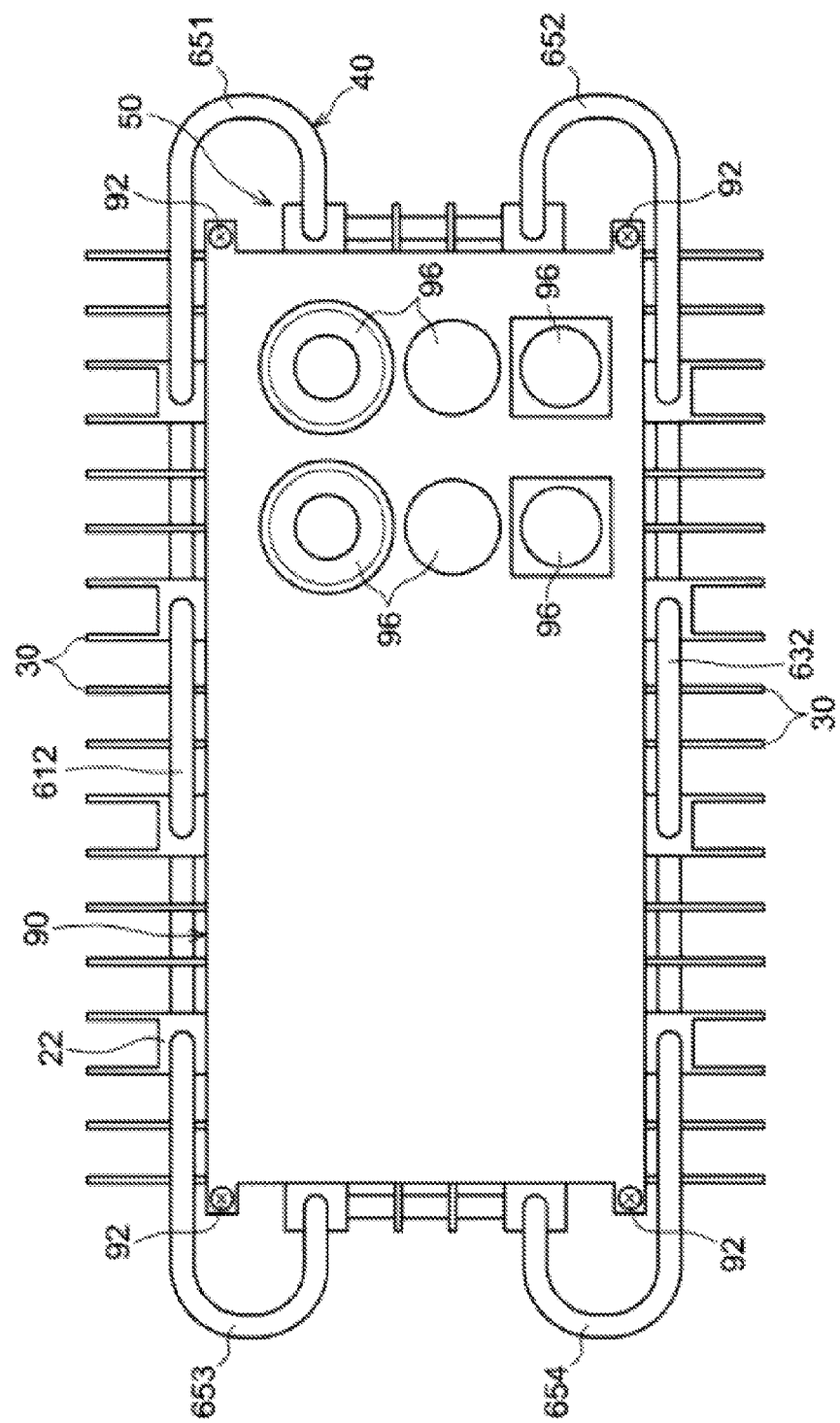
FIG. 5 is a bottom view of the base station device according to the first embodiment.

As illustrated in FIG. 2, a lid 90 is attached to a lower end portion of the housing 50. Four corners of the lid 90 are fastened to the lower end portion of the housing 50 with fastening members 92 such as screws, for example, so that the lid 90 is fixed to the housing 50. A sealing member (gasket) 94 is interposed into a part between the lid 90 and the lower end portion of the housing 50. This seals the part between the lid 90 and the lower end portion of the housing 50. Sealing the part between the lid 90 and the lower end portion of the housing 50 restricts rainwater or dust to enter into the lower end portion of the housing 50. As illustrated in FIG. 5, connectors 96 (a connection section) to electrically connect the circuit boards 101 and 103 that are housed inside the housing 50 to outer wiring are provided in plurality in the lid 90. Note that, a specific structure of an inner surface 90A of the lid 90 is omitted in FIG. 2.

Heat Pipe 40

Figure 7:
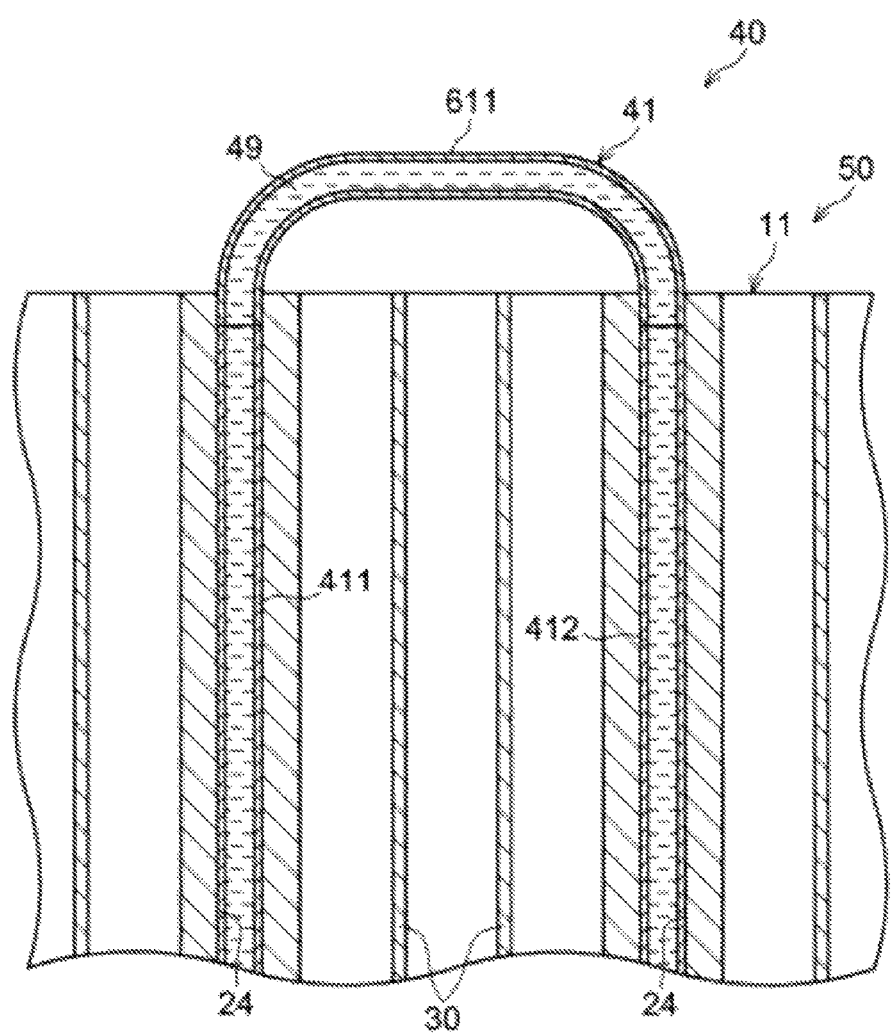
FIG. 7 is a cross-sectional side view of the heat pipe according to the first embodiment.

The heat pipe 40 (an example of a heat conduction unit) includes, as illustrated in FIG. 7, a pipe 41, and heat medium 49 that is filled in the pipe 41. A fluid such as pure water is used as the heat medium 49.

Figure 6:
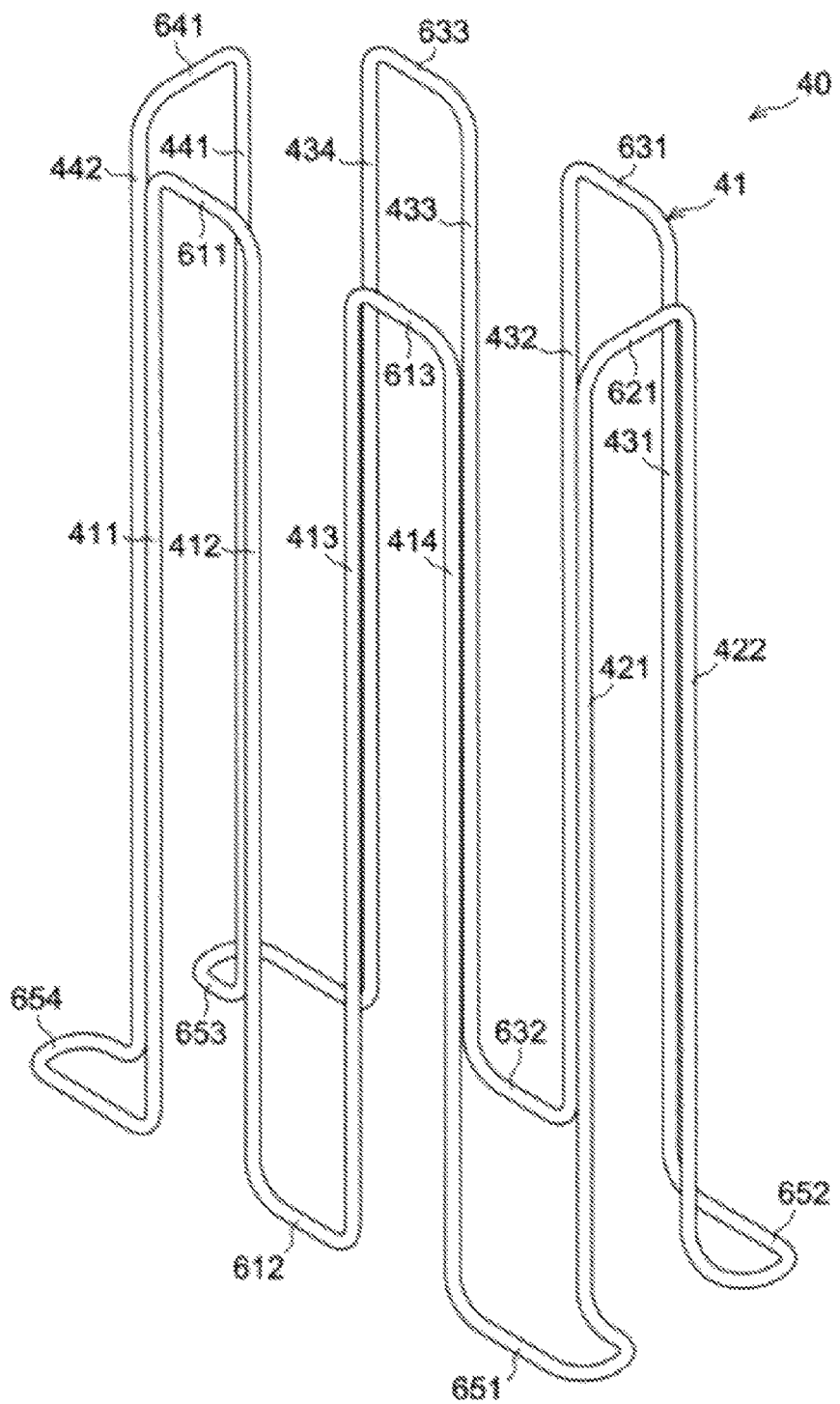
FIG. 6 is a perspective view of a heat pipe according to the first embodiment.

The pipe 41 includes, as illustrated in FIG. 6, linear sections 411, 412, 413, and 414 (hereinafter, indicated as 411 to 414), and linear sections 421 and 422. Moreover, the heat pipe 40 includes linear sections 431, 432, 433, and 434 (hereinafter, indicated as 431 to 434), and linear sections 441 and 442. The respective linear sections 411 to 414, 421, 422, 431 to 434, 441, and 442 are formed linearly along the axial direction of the housing 50. The respective linear sections 411 to 414, 421, 422, 431 to 434, 441, and 442 cause the heat medium 49 to circulate inside the housing 50.

The heat pipe 40 includes joining sections 611, 612, and 613 (hereinafter, indicated as 611 to 613), a joining section 621, joining sections 631, 632, and 633 (hereinafter, indicated as 631 to 633), and a joining section 641. The heat pipe 40 includes joining sections 651, 652, 653, and 654 (hereinafter, indicated as 651 to 654). At least a part of each of the joining sections 611 to 613, 621, 631 to 633, 641, and 651 to 654 is curved. The respective joining sections 611 to 613, 621, 631 to 633, 641, and 651 to 654 cause the heat medium 49 to circulate outside the housing 50.

The linear sections 411 to 414 (an example of a first circulation section) and the joining sections 611 to 613 are disposed to the first side plate 11. Specifically, each of the linear sections 411 to 414 is inserted into each of the insertion holes 24 in the first side plate 11. With this, the respective linear sections 411 to 414 cause the heat medium 49 to circulate in a direction orthogonal to the thickness direction of the first side plate 11. The joining section 611 joins an upper end portion of the linear section 411 and an upper end portion of the linear section 412, above the first side plate 11 (see FIG. 1). The joining section 612 joins a lower end portion of the linear section 412 and a lower end portion of the linear section 413, below the first side plate 11 (see FIG. 1). The joining section 613 joins an upper end portion of the linear section 413 and an upper end portion of the linear section 414, above the first side plate 11 (see FIG. 1).

The linear sections 421 and 422 (an example of a second circulation section) and the joining section 621 are disposed to the second side plate 12. Specifically, each of the linear sections 421 and 422 is inserted into each of the insertion holes 24 in the second side plate 12. With this, the respective linear sections 421 and 422 cause the heat medium 49 to circulate in a direction orthogonal to the thickness direction of the second side plate 12. The joining section 621 joins an upper end portion of the linear section 421 and an upper end portion of the linear section 422, above the second side plate 12 (see FIG. 1). A lower end portion of the linear section 421 is joined to a lower end portion of the linear section 414 with the joining section 651 that is disposed to the lower side of the housing 50.

The linear sections 431 to 434 (an example of the first circulation section) and the joining section 631 to 633 are disposed to the third side plate 13. Specifically, each of the linear sections 431 to 434 is inserted into each of the insertion holes 24 in the third side plate 13. With this, the respective linear sections 431 to 434 cause the heat medium 49 to circulate in a direction orthogonal to the thickness direction of the third side plate 13. The joining section 631 joins an upper end portion of the linear section 431 and an upper end portion of the linear section 432, above the third side plate 13 (see FIG. 1). The joining section 632 joins a lower end portion of the linear section 432 and a lower end portion of the linear section 433, below the third side plate 13. The joining section 633 joins an upper end portion of the linear section 433 and an upper end portion of the linear section 434, above the third side plate 13 (see FIG. 1). A lower end portion of the linear section 431 is joined to a lower end portion of the linear section 422 with the joining section 652 that is disposed to the lower side of the housing 50.

The linear sections 441 and 442 (an example of the second circulation section) and the joining section 641 are disposed to the fourth side plate 14. Specifically, each of the linear sections 441 and 442 is inserted into each of the insertion holes 24 in the fourth side plate 14. With this, the linear sections 441 and 442 cause the heat medium 49 to circulate in a direction orthogonal to the thickness direction of the fourth side plate 14. The joining section 641 joins an upper end portion of the linear section 441 and an upper end portion of the linear section 442, above the fourth side plate 14. A lower end portion of the linear section 441 is joined to a lower end portion of the linear section 434 with the joining section 653 that is disposed to the lower side of the housing 50. A lower end portion of the linear section 442 is joined to a lower end portion of the linear section 411 with the joining section 654 that is disposed to the lower side of the housing 50.

Further, the respective linear sections 411 to 414, 421, 422, 431 to 434, 441, and 442 that are inserted into the respective insertion holes 24 are bonded to the housing 50 by a method such as heating pipe-enlarging, hot joining, and soldering, for example.

In the heat pipe 40, the respective linear sections 411 to 414, 421, 422, 431 to 434, 441, and 442 are joined to one another with the respective joining sections 611 to 613, 621, 631 to 633, 641, and 651 to 654 to form a continuous path (circulating path). Further, in the heat pipe 40, the heat medium 49 passes through the side plates 11 to 14 in the order of the first side plate 11, the second side plate 12, the third side plate 13, and the fourth side plate 14. In other words, the heat medium 49 circulates along the circumferential direction of the housing 50 in the first side plate 11, the second side plate 12, the third side plate 13, and the fourth side plate 14, in this order.

The heat pipe 40 has a function to transfer heat from a high-temperature section (heating section) to a low-temperature section (cooling section). In the present embodiment, the first side plate 11 and the third side plate 13 with which the circuit boards 101 and 103 come into contact serve as the high-temperature section. In contrast, the second side plate 12 and the fourth side plate 14 with which the circuit boards 101 and 103 do not come into contact serve as the low-temperature sections.

In the heat pipe 40, the heat medium 49 vaporizes in the linear sections 411 to 414 and 431 to 434 due to the heat of the first side plate 11 and the third side plate 13. In this process, the vaporized latent heat is derived from the first side plate 11 and the third side plate 13. The vaporized heat medium 49 circulates in the linear sections 421 and 422 that are disposed to the second side plate 12 and the linear sections 441 and 442 that are disposed to the fourth side plate 14, through the heat pipe 40. Further, the vaporized heat medium 49 in the linear sections 421, 422, 441, and 442 releases heat to the second side plate 12 and the fourth side plate 14. This condenses the heat medium 49. In this manner, the heat medium 49 circulates to conduct the heat of the first side plate 11 and the heat of the third side plate 13 to the second side plate 12 and the fourth side plate 14, the first side plate 11 and the third side plate 13 respectively coming into contact with the circuit boards 101 and 103.

Connection Structure in Heat Pipe 40

Specific connection structures between the respective linear sections 411 to 414, 421, 422, 431 to 434, 441, and 442 (hereinafter, indicated as a the linear section 42) and the respective joining sections 611 to 613, 621, 631 to 633, 641, and 651 to 654 (hereinafter, indicated as a joining section 62) will be described.

Figure 8:
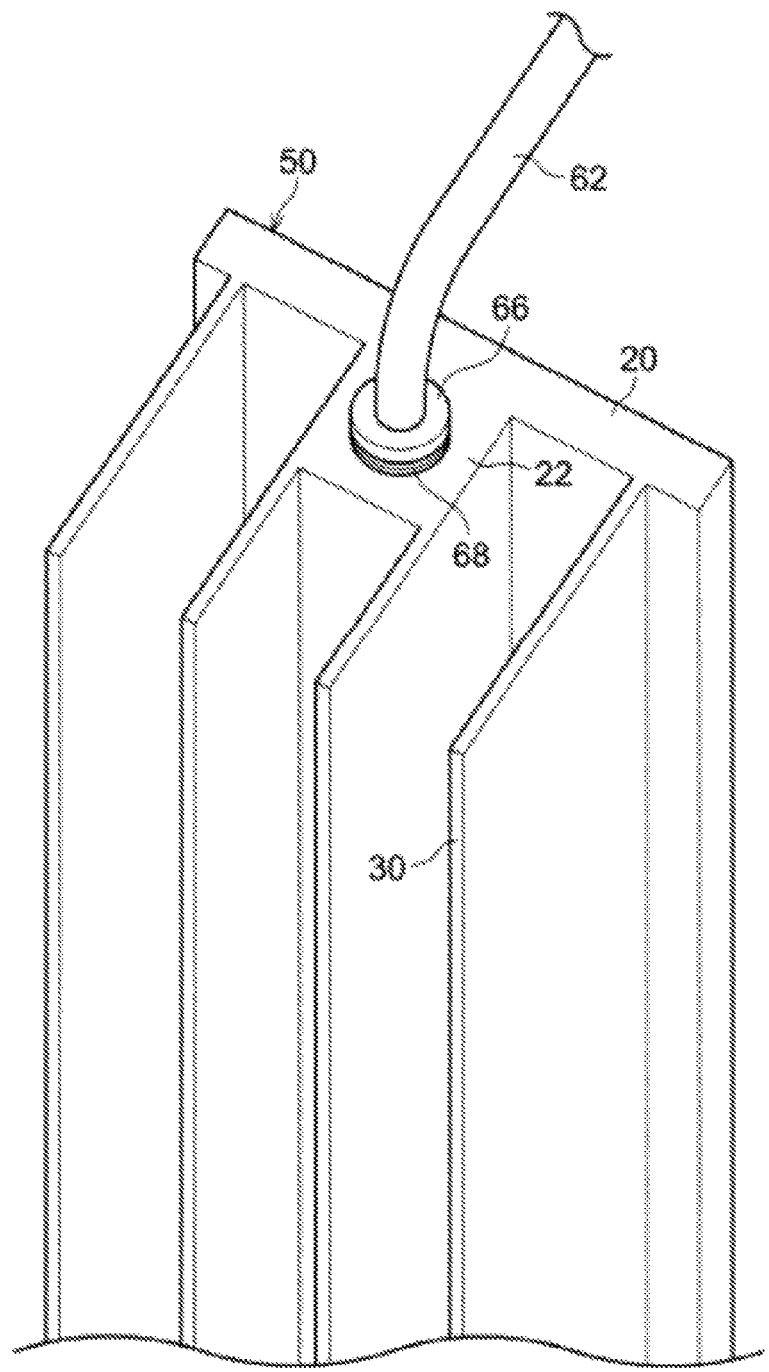
FIG. 8 is a perspective view illustrating a connection structure in the heat pipe according to the first embodiment.
Figure 9:
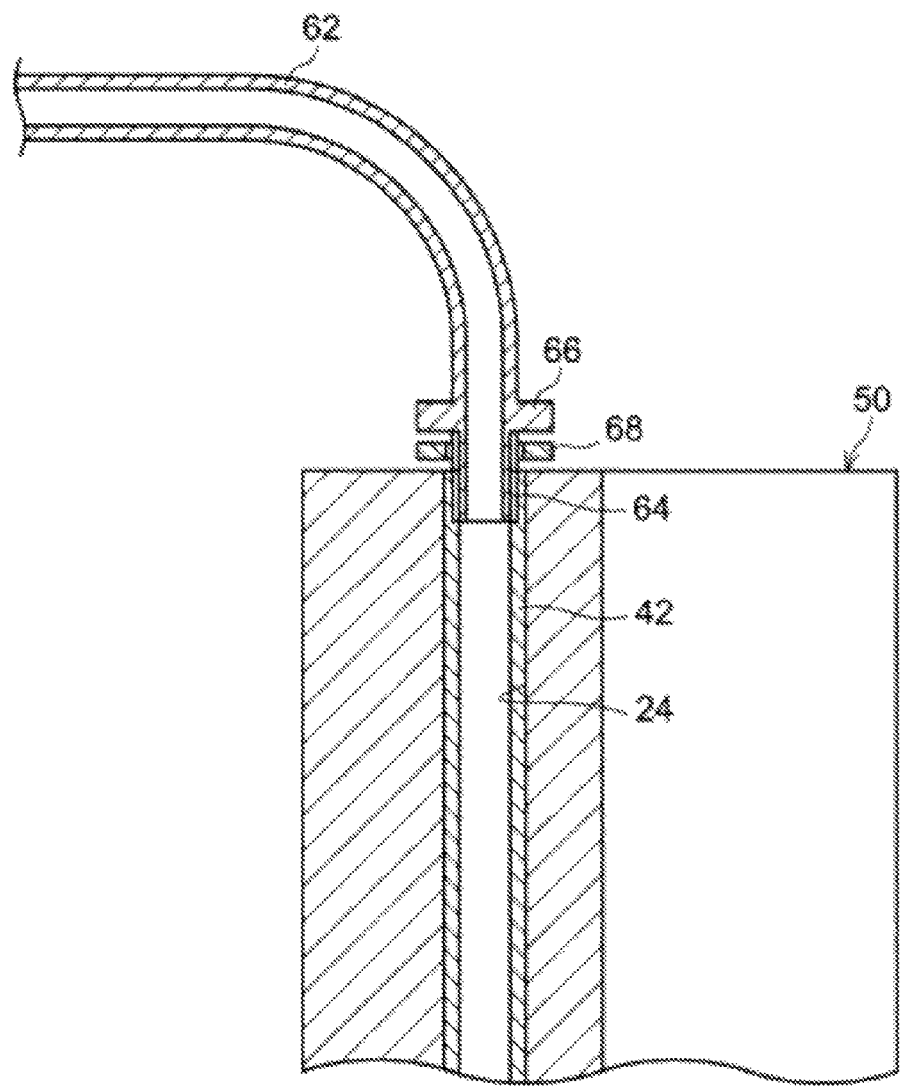
FIG. 9 is a cross-sectional side view illustrating a connection structure in the heat pipe according to the first embodiment.

As illustrated in FIG. 8 and FIG. 9, a flange section 66 that projects outward in the radial direction of the joining section 62 is formed on the joining section 62 at an axial end side. A screw section 64 that is screwed into an inner circumference of the linear section 42 is formed on an outer circumference at an axial end side relative to the flange section 66 (lower side in FIG. 9). An annular gasket (sealing member) 68 is installed in between the screw section 64 and the flange section 66.

In the structures illustrated in FIG. 8 and FIG. 9, the screw section 64 of the joining section 62 is screwed into the inner circumference of the linear section 42 to connect the linear section 42 with both open ends and the joining section 62 with both open ends to each other. In this manner, the joining section 62 with both open ends is connected to the linear section 42 with both open ends, thereby forming a sealed flow path. Moreover, in the structures illustrated in FIG. 8 and FIG. 9, the end portion of the joining section 62 is inserted into the end portion of the insertion hole 24 to be connected to the linear section 42, thereby forming a sealed flow path. This reduces use of a sealing member that seals the end portion of the insertion hole 24.

Further, structures illustrated in FIG. 10 to FIG. 15, for example, may be used as the connection structure between the linear section 42 and the joining section 62.

Figure 10:
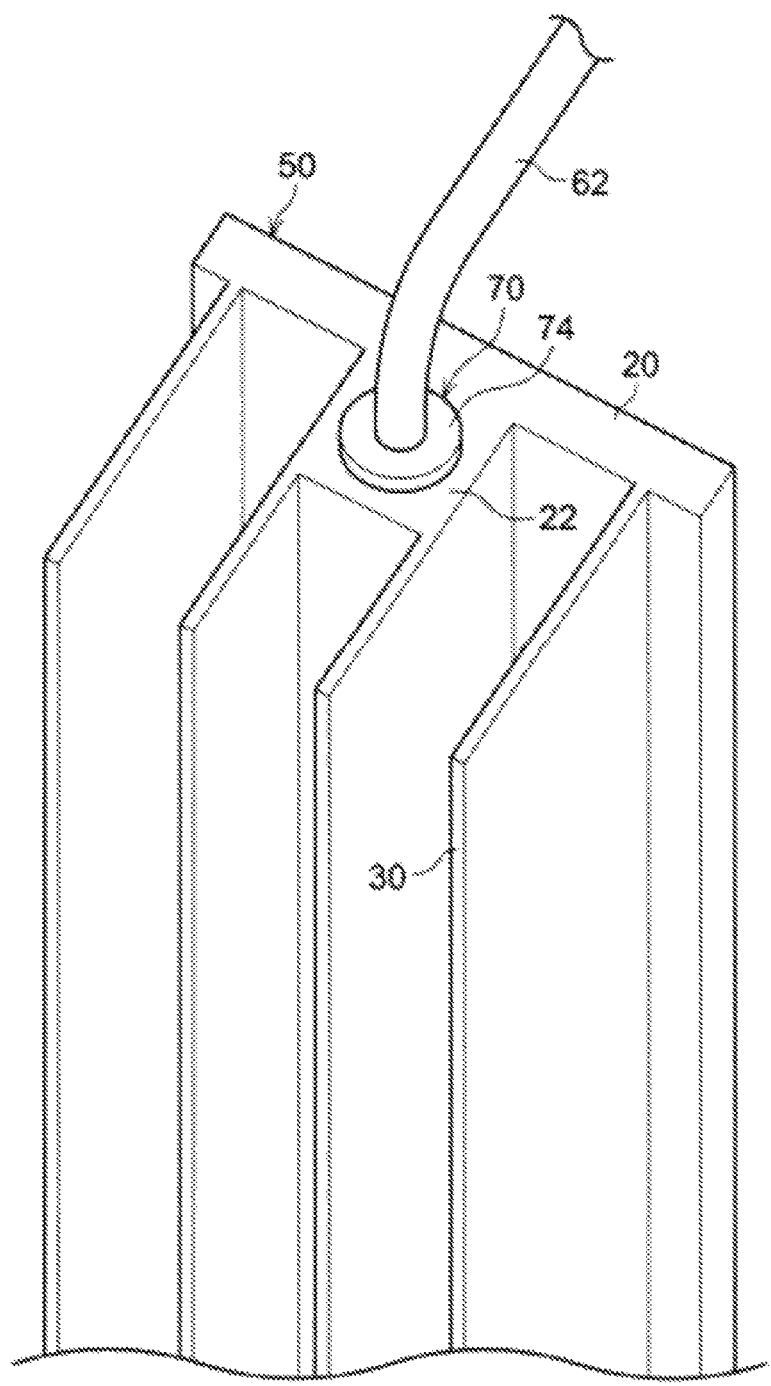
FIG. 10 is a perspective view illustrating a modification of the connection structure in FIG. 8.
Figure 11:
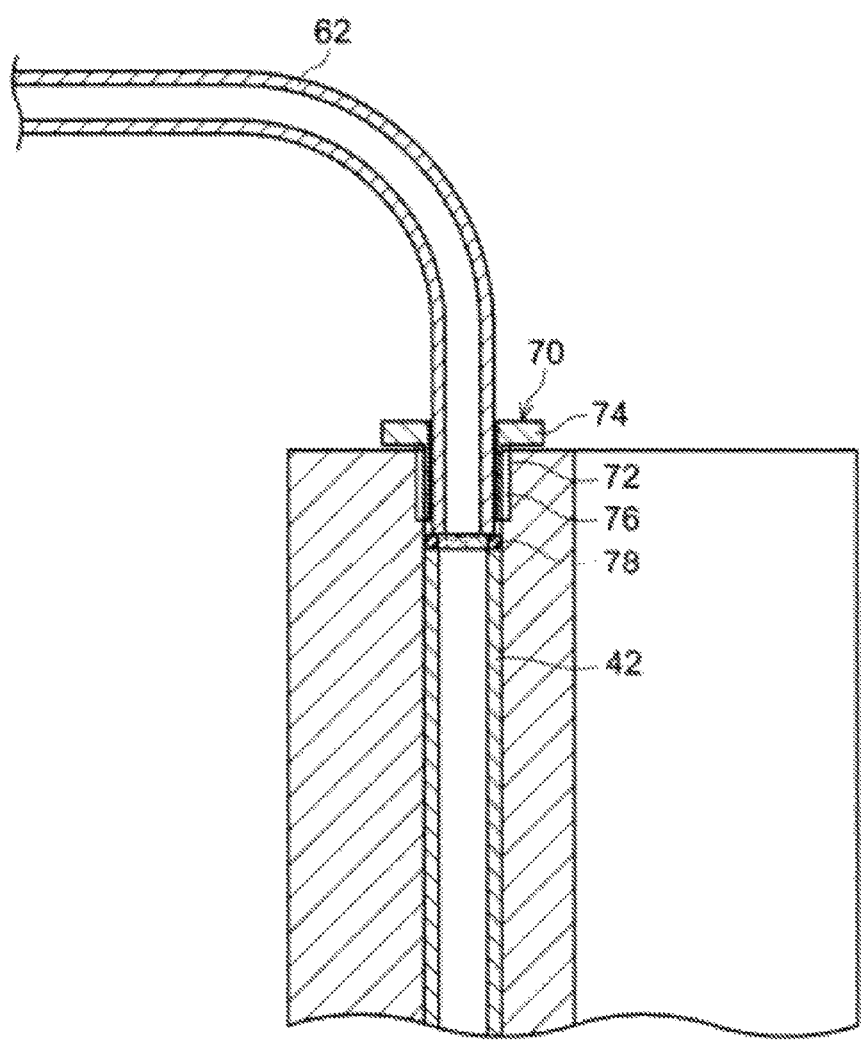
FIG. 11 is a cross-sectional side view illustrating a modification of the connection structure in FIG. 9.

In the structures illustrated in FIG. 10 and FIG. 11, a fixing member 70 for fixing the joining section 62 to the housing 50 is attached to an axial end portion of the joining section 62. The fixing member 70 includes a cylindrical section 72, and a flange section 74 that that projects outward in the radial direction of the cylindrical section 72. In a state where the axial end portion of the joining section 62 is inserted into an inner side of the cylindrical section 72, the axial end portion of the joining section 62 is fixed to the cylindrical section 72.

A screw section 76 that is screw-threaded into an inner circumference of the insertion hole 24 is formed on an outer circumference of the cylindrical section 72. Moreover, an annular gasket (sealing member) 78 is disposed in between the axial end portion of the joining section 62 (lower end portion in FIG. 11) and an axial end portion of the linear section 42 (upper end portion in FIG. 11). In the structures illustrated in FIG. 10 and FIG. 11, the screw section 76 of the fixing member 70 is screwed into the inner circumference of the linear section 42 to connect the linear section 42 and the joining section 62 to each other.

Figure 12:
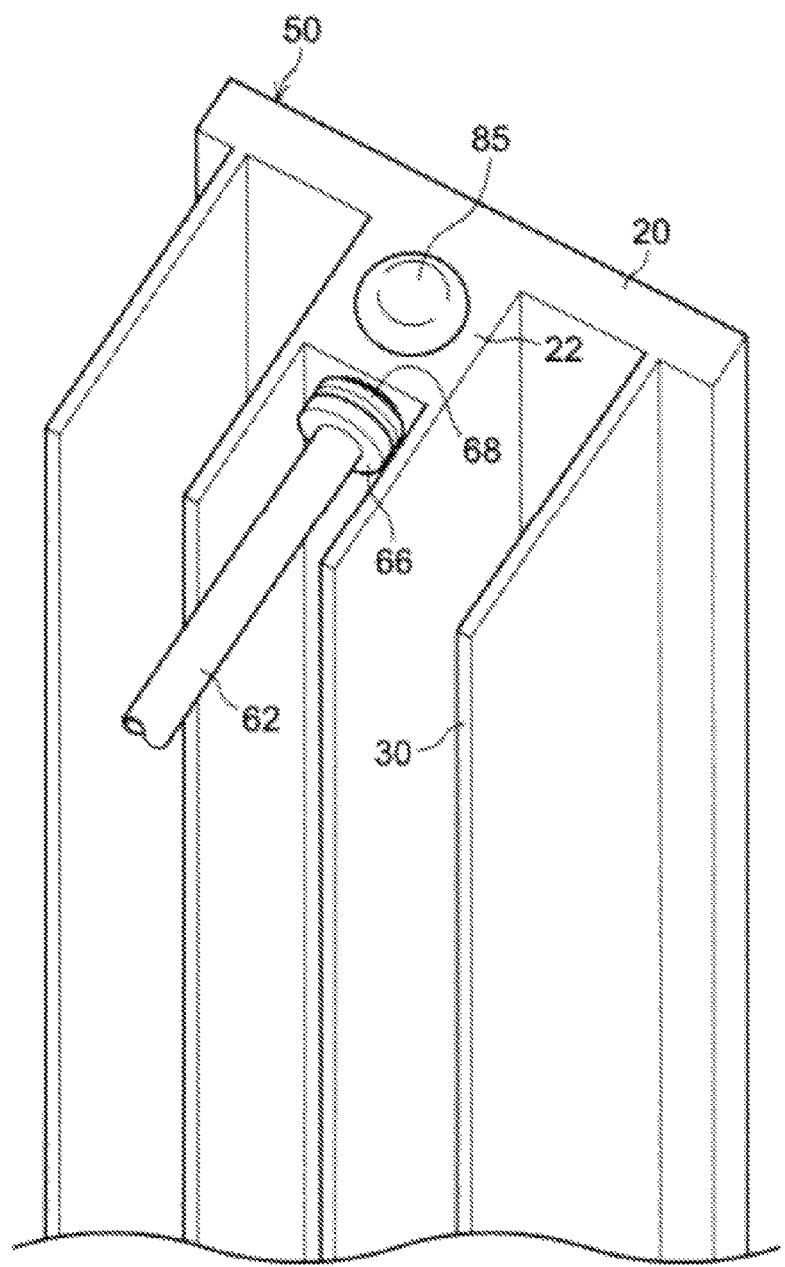
FIG. 12 is a perspective view illustrating a modification of the connection structure in FIG. 8.
Figure 13:
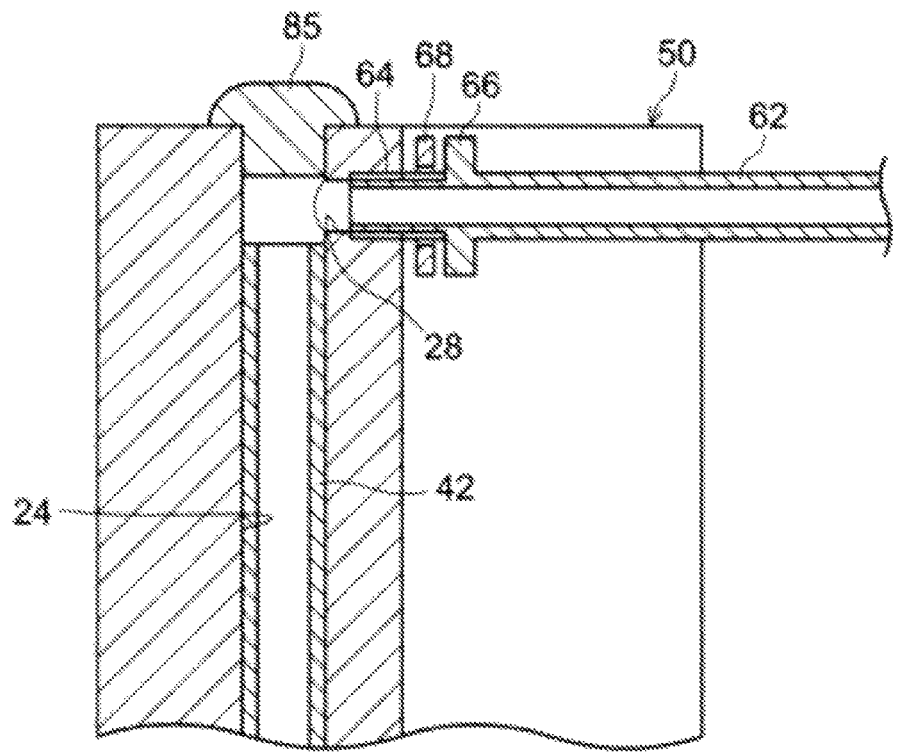
FIG. 13 is a cross-sectional side view illustrating a modification of the connection structure in FIG. 9.

In the structures illustrated in FIG. 12 and FIG. 13, an end cap 85 seals the end portion of the insertion hole 24. This forms a flow path through which the heat medium 49 circulates between the end cap 85 and the axial end portion of the linear section 42 inside the insertion hole 24. A communication hole 28 that communicates with the insertion hole 24 in a part between the end cap 85 and the axial end portion of the linear section 42 is formed at the outer side in the radial direction of the insertion hole 24. Meanwhile, a flange section 66 that projects outward in the radial direction of the joining section 62 is formed on the joining section 62 at the axial end side.

A screw section 64 that is screwed into the inner circumference of the linear section 42 is formed on the outer circumference of the axial end side relative to the flange section 66 (left side in FIG. 13). An annular gasket (sealing member) 68 is installed in between the screw section 64 and the flange section 66. In the structures illustrated in FIG. 12 and FIG. 13, the screw section 64 of the joining section 62 is screwed into the communication hole 28 to connect the linear section 42 and the joining section 62 to each other with the insertion hole 24 and the communication hole 28.

Further, in the structures illustrated in FIG. 12 and FIG. 13, the end cap 85 may be a screw or the like that is screwed into the end portion of the insertion hole 24. In this case, the screws may be used as the fastening members 82 and 91 for respectively fixing the lids 80 and 90 to the housing 50. In this manner, the sealing member that seals (closes) the end portion of the insertion hole 24 into which the heat pipe 40 is inserted may be commonly used as the fastening member 82 or 91 for respectively fixing the lid 80 or 90. This structure causes no interference by the sealing member that seals the end portion of the insertion hole 24 to the lid 80 or 90. Moreover, the structure may reduce the number of components and the number of steps in a work process.

Figure 14:
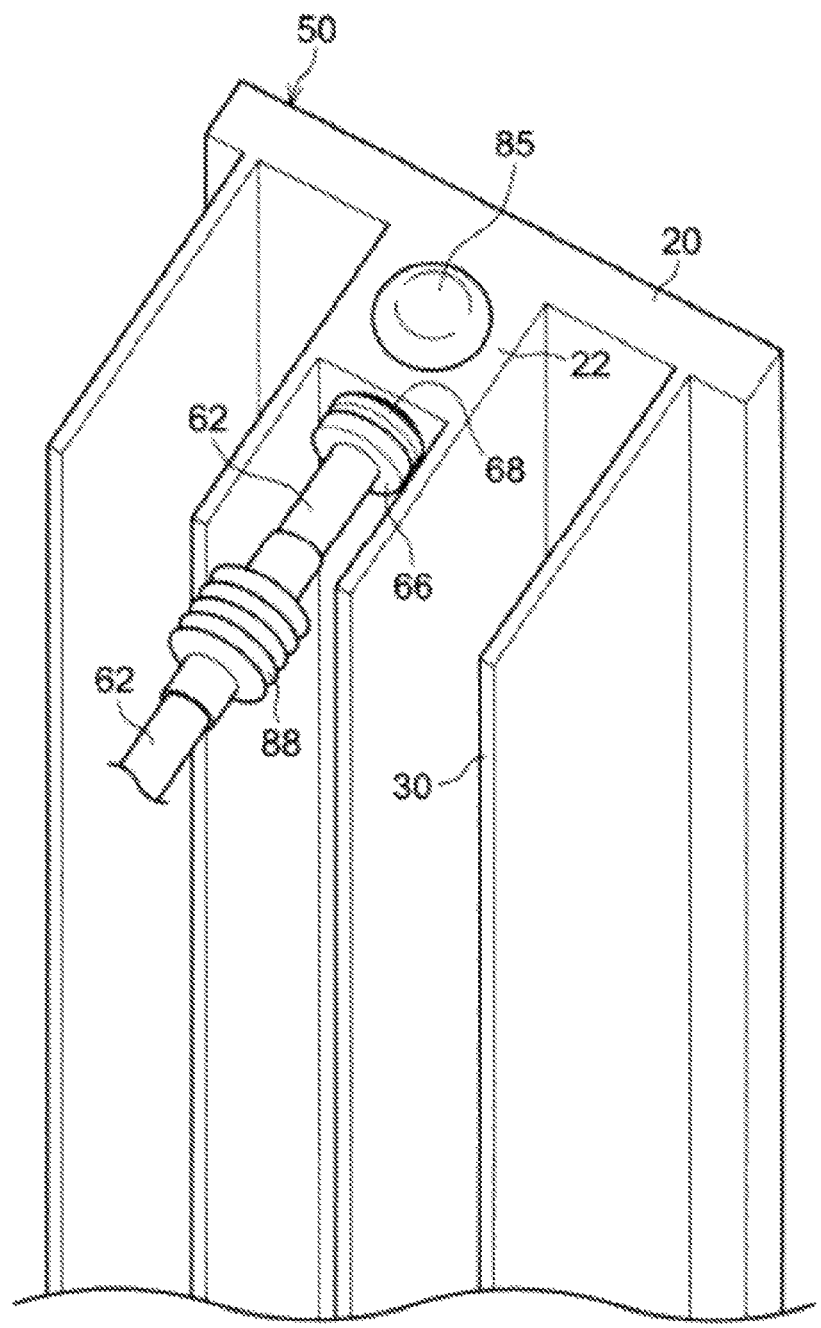
FIG. 14 is a perspective view illustrating a modification of the connection structure in FIG. 12.
Figure 15:
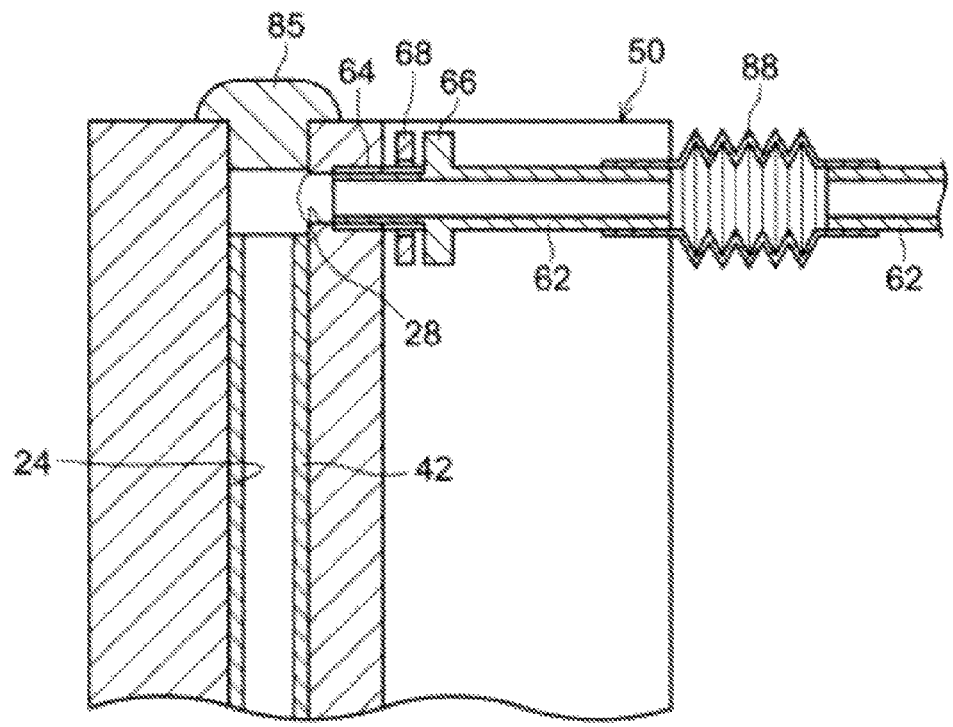
FIG. 15 is a cross-sectional side view illustrating a modification of the connection structure in FIG. 13.

In the structures illustrated in FIG. 12 and FIG. 13, as illustrated in FIG. 14 and FIG. 15, an accordion-pleated bellows pipe 88 may be provided in the joining section 62. This structure may effectively release heat from the bellows pipe 88 because of a larger contact area to the outside air than in a case where a cylindrical pipe is used.

Further, methods including caulking, soldering, welding, and the like may be used for the connection structure between the linear section 42 and the joining section 62.

Effect by First Embodiment

An effect by the first embodiment will be described.

In the first embodiment, the circuit board 101 that is disposed to the inner surface 11A of the first side plate 11 generates heat. This allows part of the heat of the circuit board 101 to be conducted to the first side plate 11. Moreover, the circuit board 103 that is disposed to the inner surface 13A of the third side plate 13 generates heat. This allows part of the heat of the circuit board 103 to be conducted to the third side plate 13.

The parts of the heat having been conducted to the first side plate 11 and the third side plate 13 are released from the heat dissipation fins 30 that are respectively formed on the first side plate 11 and the third side plate 13. Moreover, the part of the heat having been conducted to the first side plate 11 is directly conducted to the second side plate 12 and the fourth side plate 14 through a joining portion between the first side plate 11 and the second side plate 12 and a joining portion between the first side plate 11 and the fourth side plate 14. The part of the heat having been conducted to the third side plate 13 is directly conducted to the second side plate 12 and the fourth side plate 14 through a joining portion between the third side plate 13 and the second side plate 12 and a joining portion between the third side plate 13 and the fourth side plate 14.

In addition, the heat medium 49 vaporizes in the linear sections 411 to 414 and 431 to 434 of the heat pipe 40 due to the parts of the heat having been conducted to the first side plate 11 and the third side plate 13. In this process, the vaporized latent heat is derived from the first side plate 11 and the third side plate 13. The vaporized heat medium 49 circulates in the linear sections 421 and 422 that are disposed to the second side plate 12 and the linear sections 441 and 442 that are disposed to the fourth side plate 14, through the joining section 651 and the joining section 653.

Further, the vaporized heat medium 49 in the linear sections 421, 422, 441, and 442 releases heat to the second side plate 12 and the fourth side plate 14. This condenses the heat medium 49. The heat having been released to the second side plate 12 and the heat having been released to the fourth side plate 14 are released from the heat dissipation fins 30 that are respectively formed on the second side plate 12 and the fourth side plate 14.

In this manner, the heat of the circuit board 101 and the heat of the circuit board 103 are not only directly conducted to the second side plate 12 and the fourth side plate 14 from the first side plate 11 and the third side plate 13, respectively, but also conducted to the second side plate 12 and the fourth side plate 14 from the first side plate 11 and the third side plate 13, respectively, through the heat pipe 40.

This reduces a difference between the temperature at the first side plate 11 and the third side plate 13 and the temperature at the second side plate 12 and the fourth side plate 14, compared with a structure having no heat pipe 40. This reduces a difference between the amount of heat dissipation from the heat dissipation fins 30 on the second side plate 12 and the fourth side plate 14 and the amount of heat dissipation from the heat dissipation fins 30 on the first side plate 11 and the third side plate 13.

In other words, the heat of the circuit board 101 and the heat of the circuit board 103 are released not only from the heat dissipation fins 30 on the first side plate 11 and the third side plate 13, but also from the heat dissipation fins 30 on the second side plate 12 and the fourth side plate 14 that do not come into contact with the circuit boards 101 and 103. This improves the heat dissipation efficiency to release the heat of the circuit board 101 and the heat of the circuit board 103.

In particular, in the present embodiment, the heat medium 49 passes through all the side plates 11 to 14 in the housing 50, thereby reducing differences in temperature in all the side plates 11 to 14. This reduces variation in the amounts of heat dissipation from the heat dissipation fins 30 on the side plates 11 to 14, thereby effectively improving the heat dissipation efficiency.

Moreover, in the present embodiment, the heat medium 49 circulates in the first side plate 11, the second side plate 12, the third side plate 13, and the fourth side plate 14 in this order to achieve a simpler path than in a case where the heat medium 49 circulates in the first side plate 11, the third side plate 13, the second side plate 12, and the fourth side plate 14 in this order, for example. Moreover, the heat medium 49 circulates in the side plate that comes into contact with the circuit board and the side plate that does not come into contact with the circuit board circuit board in this order, out of the side plates 11 to 14. This may effectively reduce the differences in temperature among the side plates 11 to 14.

Moreover, in the present embodiment, the respective joining sections 611 to 613, 621, 631 to 633, 641, and 651 to 654 cause the heat medium 49 to circulate outside the housing 50. This allows heat to be released in the air also from the respective joining sections 611 to 613, 621, 631 to 633, 641, and 651 to 654.

Moreover, in the present embodiment, the circuit boards 101 and 103 are housed in the housing space 21 inside the housing 50. For this reason, the housing 50 has the open upper end portion and the open lower end portion. Further, the lids 80 and 90 close the upper end portion and the lower end portion of the housing 50. In addition, the sealing members (gaskets) 84 and 94 seal parts between the lids 80 and 90 and the housing 50. This allows the parts between the lids 80 and 90 and the housing 50 to be sealed to restrict rainwater or dust to enter in the housing 50 even when the base station device 10 is installed outdoors.

Moreover, in the present embodiment, the heat exchange with the outside air by the heat dissipation fins 30 cools (condenses) a refrigerant, thereby reducing use of the electric power when the refrigerant is cooled. This reduces connection with the power supply, thereby achieving flexibility in installation location. Accordingly, the present embodiment is effective for the base station device 10 that is installed outdoors.

Further, when no circuit board 103 is provided or when the amount of heat generation from the circuit board 103 is smaller than the amount of heat generation from the circuit board 101, the temperature at the third side plate 13 becomes lower than the temperature at the first side plate 11. In this case, the heat of the first side plate 11 may be moved to the third side plate 13. In other words, in this case, the third side plate 13 functions as an example of a second plate to which the heat of the first side plate 11 is conducted.

Modification of Path of Heat Pipe 40

Next, a modification of the path of the heat pipe 40 will be described.

Figure 16:
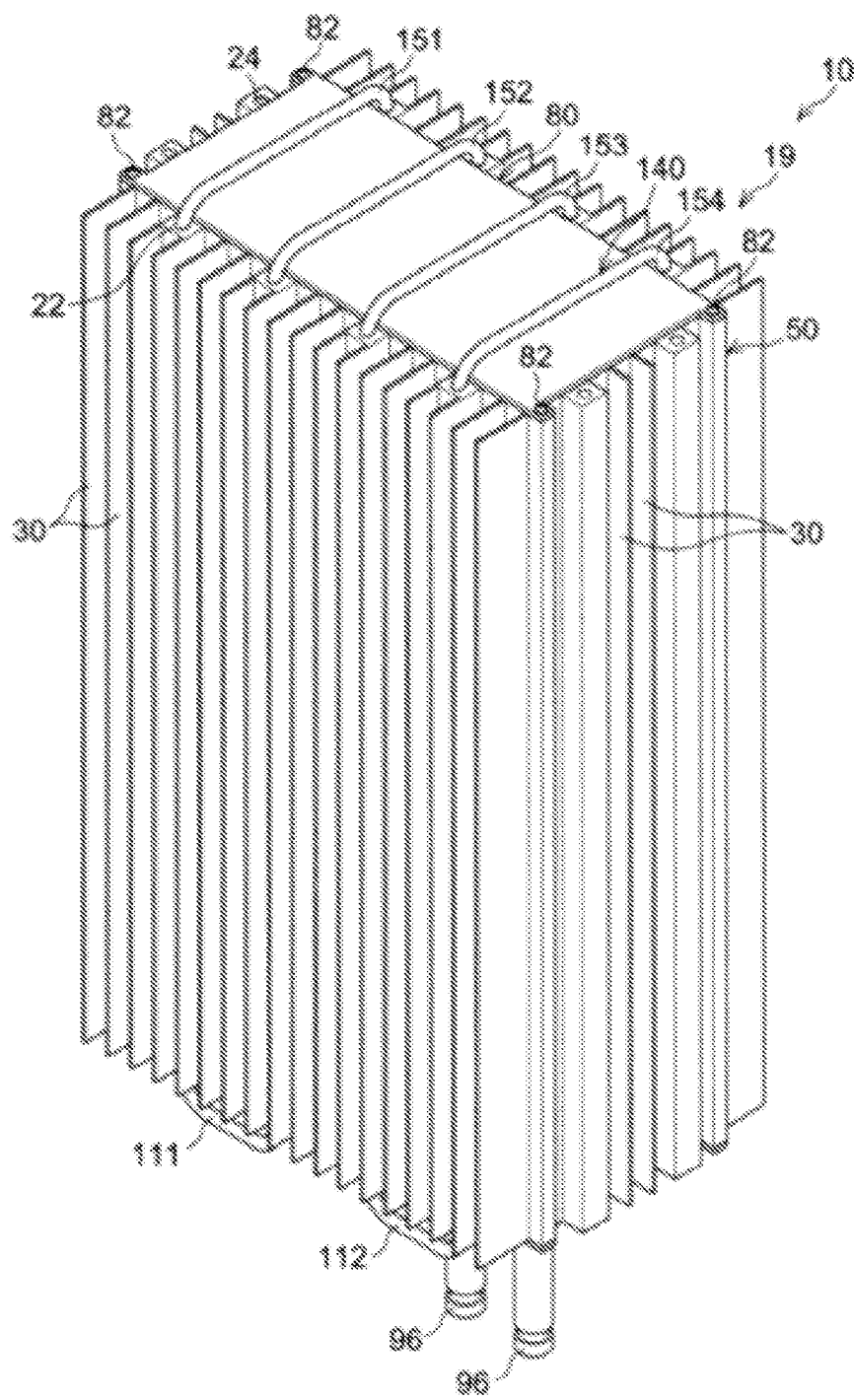
FIG. 16 is a perspective view illustrating a modification of the base station device in FIG. 1.
Figure 17:
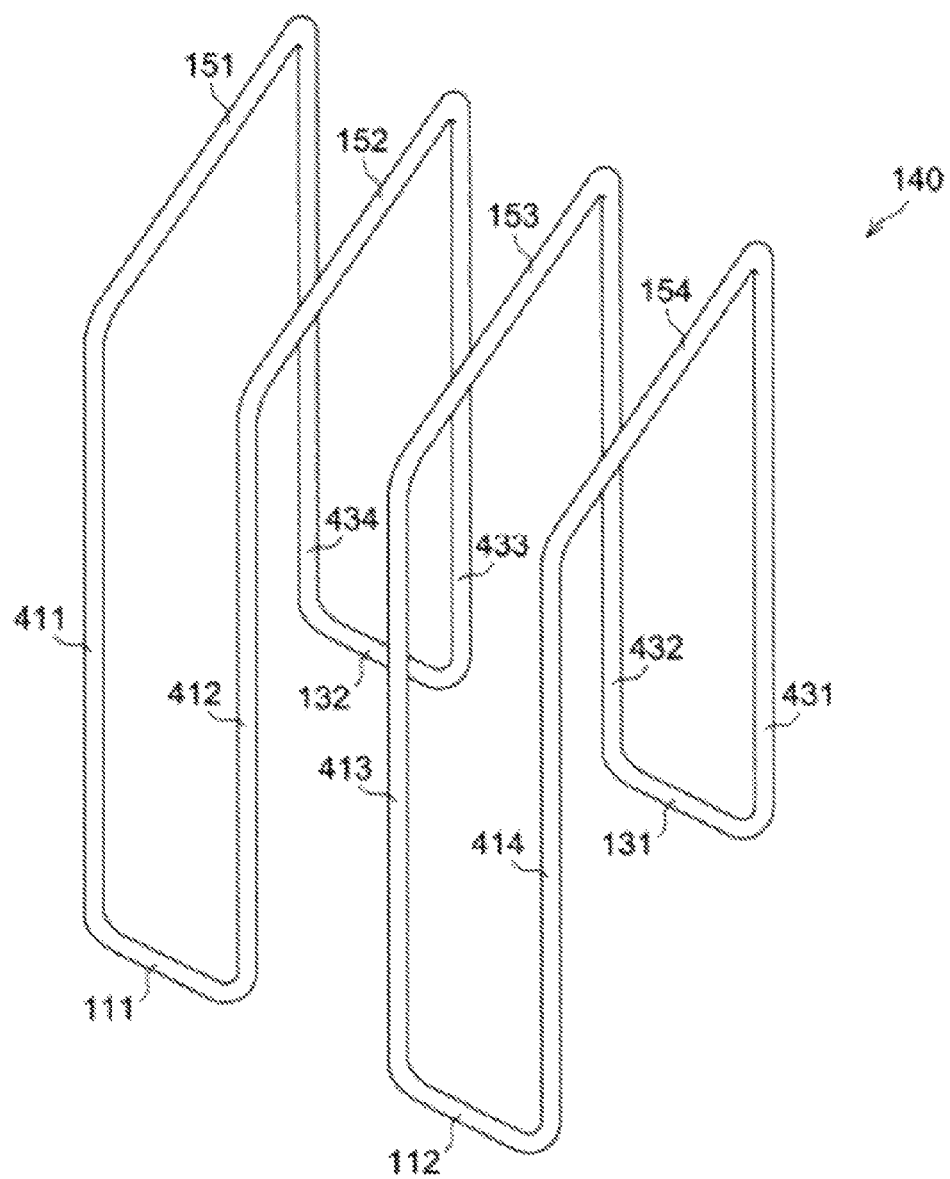
FIG. 17 is a perspective view illustrating a heat pipe of the base station device in FIG. 16.

FIG. 16 and FIG. 17 illustrate a heat pipe 140 of which path is different from the path of the heat pipe 40.

The heat pipe 140 illustrated in FIG. 16 includes, as illustrated in FIG. 17, two paths (circulating paths) through which the heat medium circulates. The heat pipe 140 includes, similar to the heat pipe 40 illustrated in FIG. 6, the linear sections 411 to 414 and the linear sections 431 to 434. The heat pipe 140 further includes joining sections 111, 112, 131, 132, 151, 152, 153, and 154. The joining sections 111, 112, 131, 132, 151, 152, 153, and 154 cause the heat medium 49 to circulate outside the housing 50. This allows heat to be released in the air also from the joining sections 111, 112, 131, 132, 151, 152, 153, and 154.

The joining section 111 joins the lower end portion of the linear section 411 and the lower end portion of the linear section 412, below the first side plate 11. The joining section 112 joins the lower end portion of the linear section 413 and the lower end portion of the linear section 414, below the first side plate 11.

The joining section 131 joins the lower end portion of the linear section 431 and the lower end portion of the linear section 432, below the third side plate 13. The joining section 132 joins the lower end portion of the linear section 433 and the lower end portion of the linear section 434, below the third side plate 13.

The joining section 151 joins the upper end portion of the linear section 411 and the upper end portion of the linear section 434, above the lid 80. The joining section 152 joins the upper end portion of the linear section 412 and the upper end portion of the linear section 433, above the lid 80. The joining section 153 joins the upper end portion of the linear section 413 and the upper end portion of the linear section 432, above the lid 80. The joining section 154 joins the upper end portion of the linear section 414 and the upper end portion of the linear section 431, above the lid 80.

In this manner, the joining sections 151, 152, 153, and 154 are disposed so as to extend across from the first side plate 11 to the third side plate 13.

In the heat pipe 140, the linear sections 411 and 412 and the linear section 433 and 434 are joined to one another with the joining sections 111, 132, 151, and 152 to form a continuous path (circulating path). Moreover, the linear sections 413 and 414 and the linear sections 431 and 432 are joined to one another with the joining sections 112 and 131, 153, and 154 to form a continuous path (circulating path). In the respective paths, the heat medium 49 passes through the first side plate 11 and the third side plate 13.

Here, in the present modification, the amount of heat generation from the circuit board 101 is more than the amount of heat generation from the circuit board 103. In a case where the amount of heat generation from the circuit board 101 is more than the amount of heat generation from the circuit board 103, the first side plate 11 with which the circuit board 101 comes into contact serves as the high-temperature section, and the third side plate 13 with which the circuit board 103 comes into contact serves as the low-temperature section.

The heat medium circulates through the heat pipe 140 to reduce a difference in temperature between the first side plate 11 and the third side plate 13. This reduces a difference between the amount of heat dissipation from the heat dissipation fins 30 on the first side plate 11 and the amount of heat dissipation from the heat dissipation fins 30 on the third side plate 13. In other words, the heat dissipation fins 30 on the first side plate 11 and the heat dissipation fins 30 on the third side plate 13 exhibit the similar heat dissipation function. This allows part of the heat of the circuit board 101 and the heat of the circuit board 103 to be released with high efficiency.

In this manner, in the modification, the use of the heat pipe 140 reduces the difference in temperature between the first side plate 11 and the third side plate 13 that are not adjacent to each other, thereby improving the heat dissipation efficiency.

Moreover, in the modification, the heat medium 49 does not pass through the second side plate 12 and the fourth side plate 14. In other words, the insertion holes 24 in the second side plate 12 and the fourth side plate 14 are hollow. This restricts the heat of the second side plate 12 and the heat of the fourth side plate 14 to be conducted. This structure is effective in a case where the heat is not intended to be conducted to the second side plate 12 and the fourth side plate 14 (for example, the second side plate 12 and the fourth side plate 14 have a lower allowable temperature) or other cases.

Further, the path of the heat pipe is not limited to the path of the heat pipe 140 illustrated in FIG. 17 and the path of the heat pipe 40 illustrated in FIG. 6, but various paths may be used.

Second Embodiment

Figure 18:
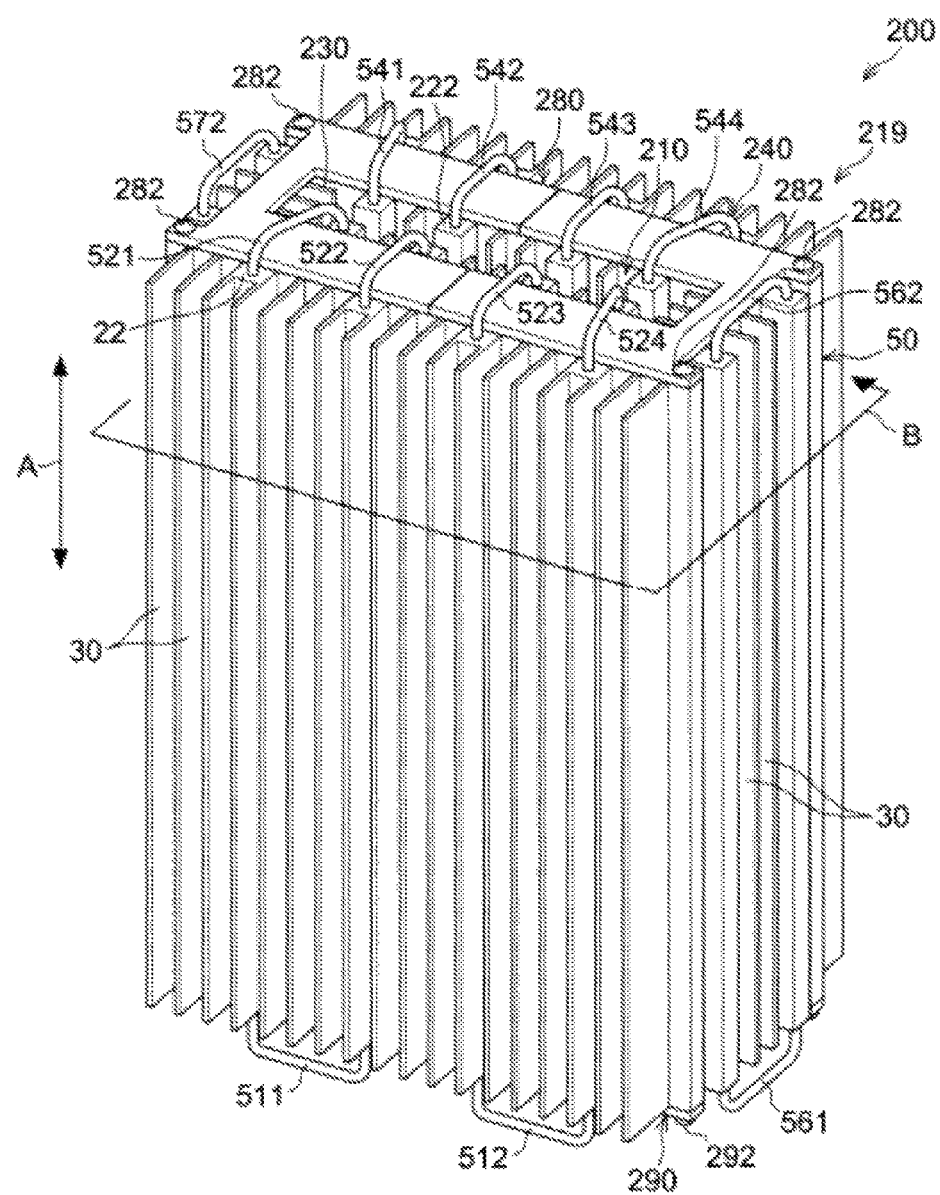
FIG. 18 is a perspective view of a base station device according to a second embodiment.

Next, a base station device 200 according to a second embodiment will be described. FIG. 18 is a perspective view illustrating the base station device 200 according to the second embodiment. Note that, the same reference numerals are assigned to the portions with the same structure as the first embodiment, and explanations thereof are omitted as appropriate.

Figure 19:
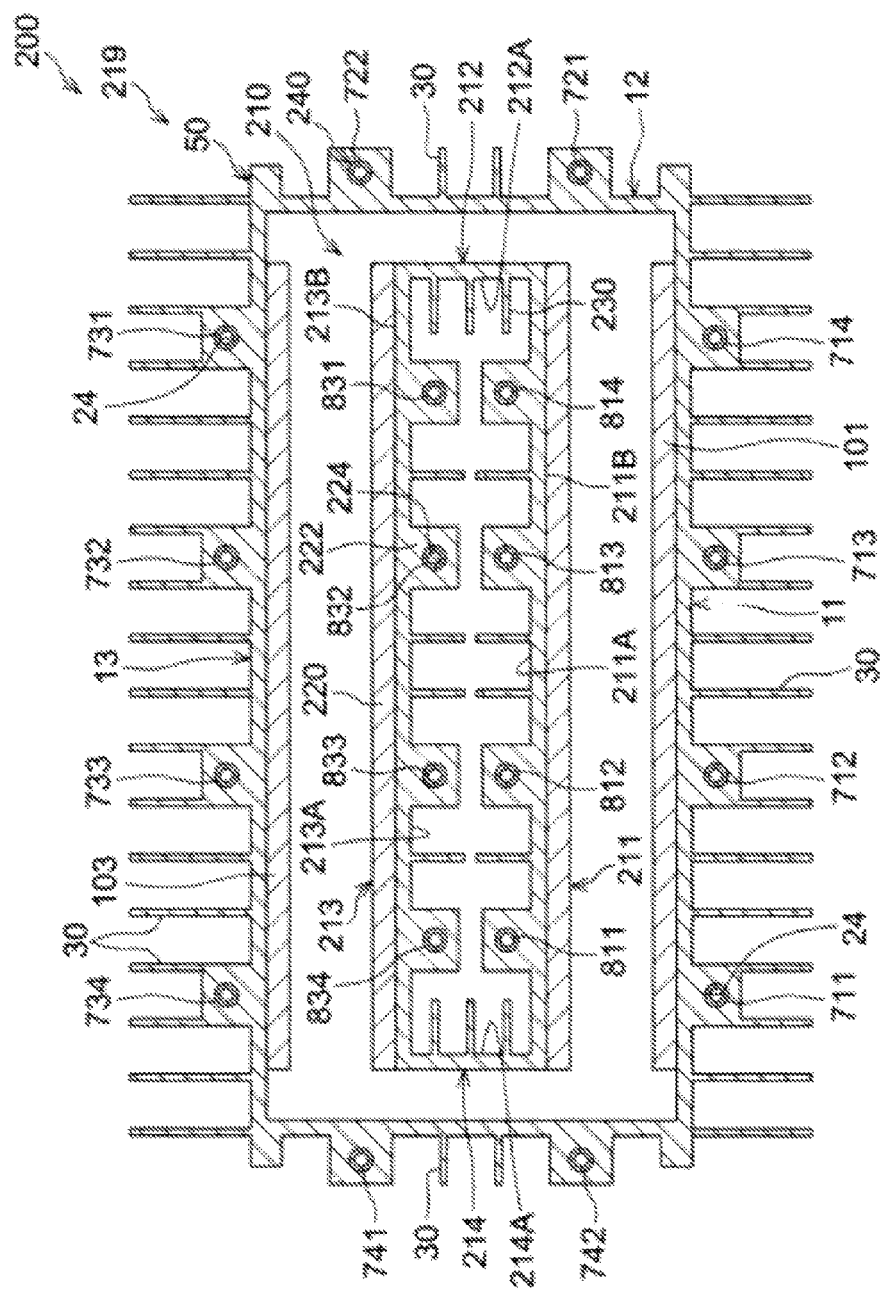
FIG. 19 is a cross-sectional plan view of the base station device according to the second embodiment.

The base station device 200 includes, as illustrated in FIG. 18 and FIG. 19, an inner tube 210, in addition to the housing 50 in the base station device 10. The base station device 200 is provided with a heat pipe 240, instead of the heat pipe 40 in the base station device 10. The base station device 200 is provided with lids 280 and 290, instead of the lids 80 and 90 in the base station device 10.

Figure 20:
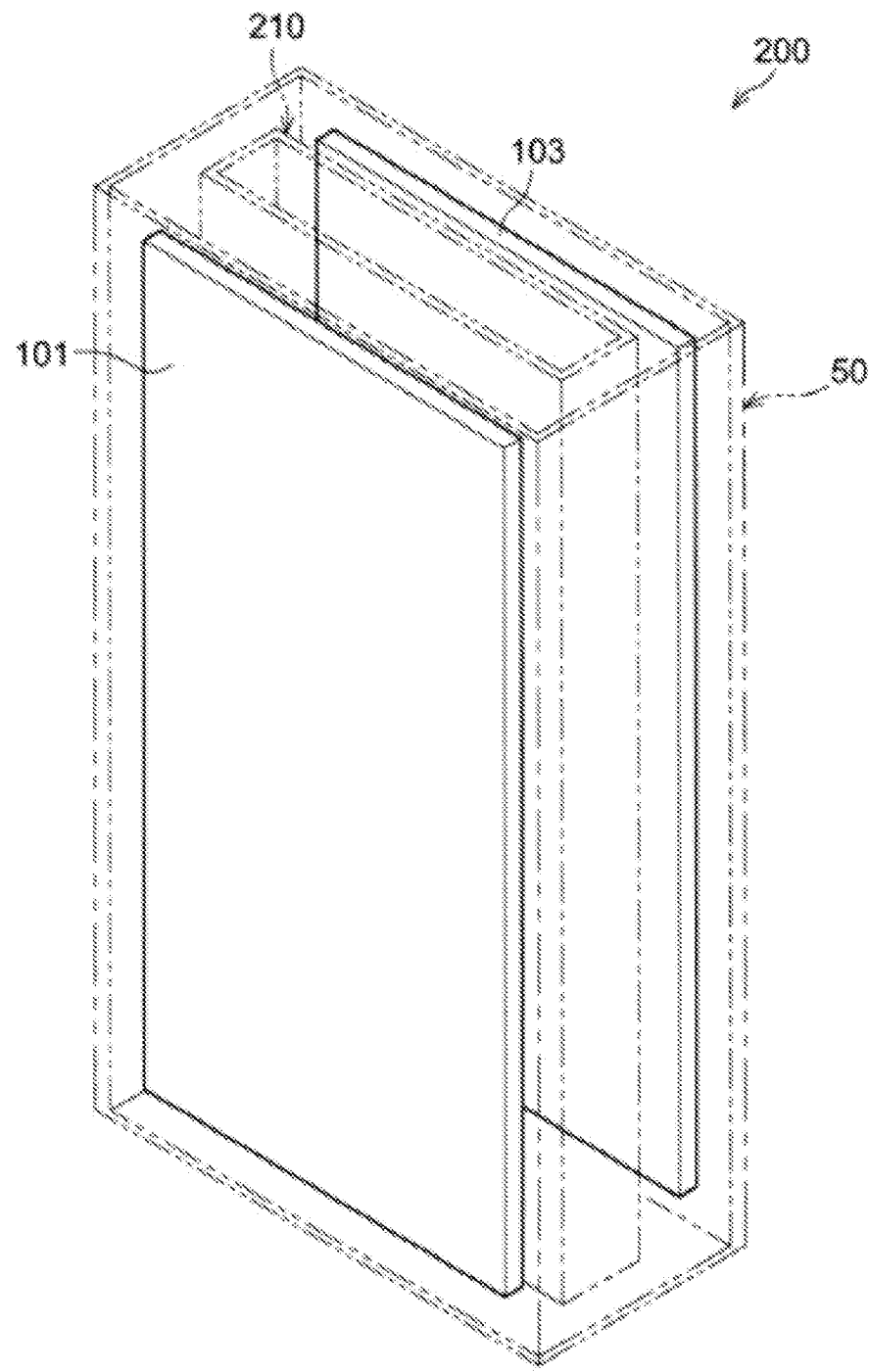
FIG. 20 a perspective view seen through the interior of the base station device according to the second embodiment.

In addition, the base station device 200 includes, as illustrated in FIG. 19 and FIG. 20, similar to the base station device 10, the circuit boards 101 and 103 that are disposed inside the housing 50. In the base station device 200, heat generated from the circuit board 101 and heat generated from the circuit board 103 are released by the housing 50, the inner tube 210, and the heat pipe 240. In other words, the base station device 200 is provided with a heat dissipation device (heat dissipation structure) 219 including the housing 50, the inner tube 210, and the heat pipe 240. Hereinafter, specific structures of the inner tube 210, the heat pipe 240, and the lids 80 and 90 will be described.

Inner Tube 210

The inner tube 210 includes, as illustrated in FIG. 19 and FIG. 20, a first side plate 211, a second side plate 212, a third side plate 213, and a fourth side plate 214. Hereinafter, the first side plate 211, the second side plate 212, the third side plate 213, and the fourth side plate 214 are collectively indicated as side plates 211 to 214.

The side plates 211 to 214 form a peripheral wall (side wall) of the inner tube 210. Specifically, the second side plate 212 is a side plate adjacent to the first side plate 211. The third side plate 213 is a side plate adjacent to the second side plate 212 and opposed to the first side plate 211. The fourth side plate 214 is a side plate adjacent to the third side plate 213 and the first side plate 211, and opposed to the second side plate 212. Further, the peripheral wall of the inner tube 210 is tubular with a rectangular cross-section in which the first side plate 211 and the third side plate 213 are longer.

As illustrated in FIG. 19, each of the side plates 211 and 213 includes a base plate 220, and projection sections 222 that are provided in plurality with intervals on an inner surface of the base plate 220.

The projection sections 222 protrude inward from the inner surface of the base plate 220. The projection sections 222 are provided to be extended along an axial direction (A direction) and provided in plurality with intervals along a circumferential direction (B direction) of the inner tube 210 disposed between the side plates 211 and 213. Specifically, four projection sections 222, for example, are respectively disposed to the first side plate 11 and the third side plate 13.

Insertion holes 224 into which the heat pipe 240 is inserted are formed in the projection sections 222. The insertion hole 224 penetrates through the projection section 222 along the axial direction of the inner tube 210 (A direction).

Multiple heat dissipation fins 230 are formed on an inner circumferential surface of the inner tube 210. Specifically, the multiple heat dissipation fins 230 are respectively formed on inner surfaces 211A, 212A, 213A, and 214A of the side plates 211 to 214. Each of the heat dissipation fins 230 is formed along the axial direction of the inner tube 210 (A direction). The multiple heat dissipation fins 230 are disposed to along a circumferential direction of the inner tube 210 (B direction). The multiple heat dissipation fins 230 are integrally formed with the base plates 220 and the projection sections 222 described above.

A space at the inner circumference side of the inner tube 210 has open axial both-end portions. This allows the air to circulate in the axial direction. Further, the inner tube 210 is formed by extrusion molding, for example. The inner tube 210 is formed of a metal material such as aluminum.

Lids 280 and 290

Figure 21:
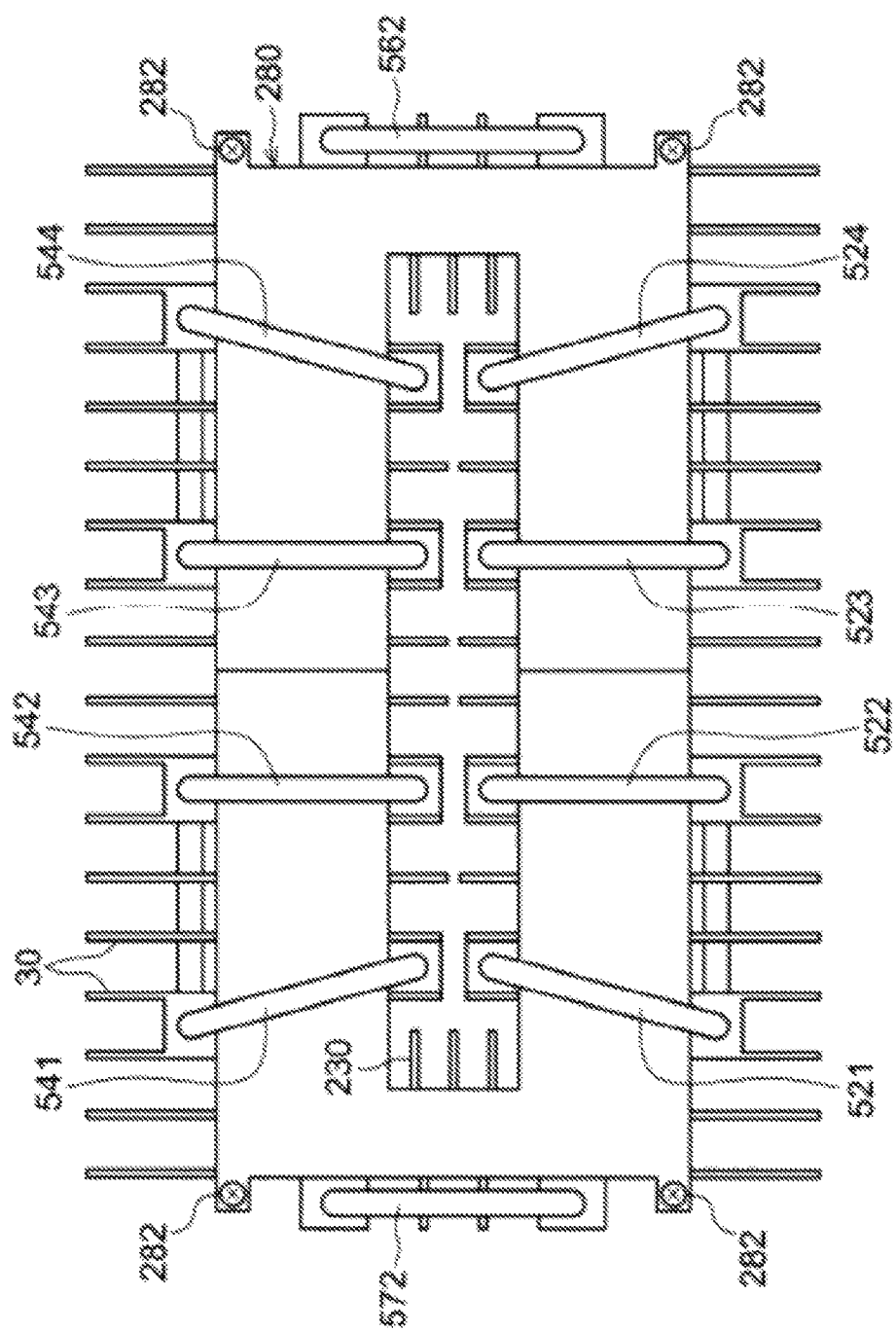
FIG. 21 is a plan view of the base station device according to the second embodiment.

As illustrated in FIG. 18 and FIG. 21, a lid 280 is attached to upper end portions of the housing 50 and the inner tube 210. Four corners of the lid 280 are fastened to the upper end portion of the housing 50 with fastening members 282 such as screws, for example, so that the lid 280 is fixed to the housing 50. Sealing members (gaskets) are interposed into a part between the lid 280 and the upper end portion of the housing 50 and a part between the lid 280 and the upper end portion of the inner tube 210. This seals the part between the lid 280 and the upper end portion of the housing 50 and the part between the lid 280 and the upper end portion of the inner tube 210. Sealing the part between the lid 280 and the upper end portion of the housing 50 and the part between the lid 280 and the upper end portion of the inner tube 210 restricts rainwater or dust to enter into the upper end portion of the housing 50.

Figure 22:
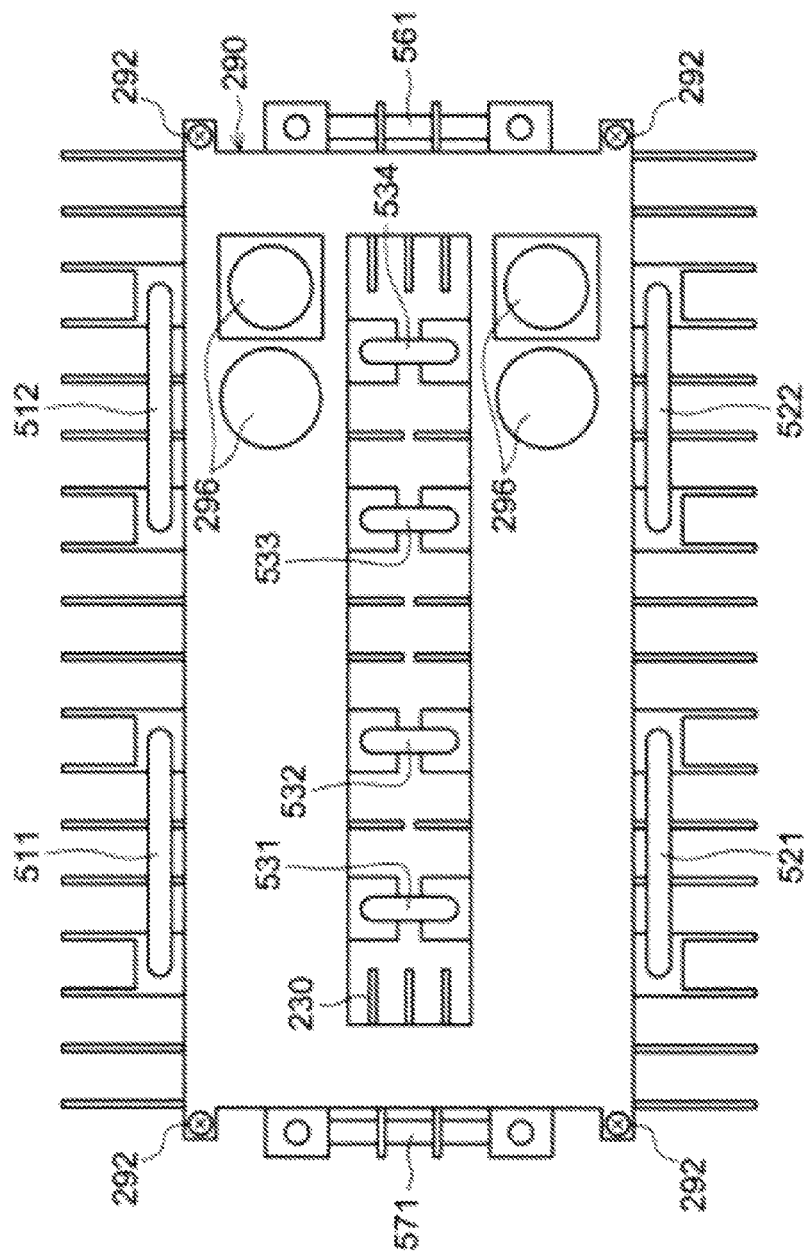
FIG. 22 is a bottom view of the base station device according to the second embodiment.

As illustrated in FIG. 22, a lid 290 is attached to lower end portions of the housing 50 and the inner tube 210. Four corners of the lid 290 are fastened to the lower end portion of the housing 50 with fastening members 292 such as screws, for example, so that the lid 290 is fixed to the housing 50. Sealing members (gaskets) are interposed into a part between the lid 290 and the lower end portion of the housing 50 and a part between the lid 290 and the lower end portion of the inner tube 210.

This seals the part between the lid 290 and the lower end portion of the housing 50 and the part between the lid 290 and the lower end portion of the inner tube 210. Sealing the part between the lid 290 and the lower end portion of the housing 50 and the part between the lid 290 and the lower end portion of the inner tube 210 restricts rainwater or dust to enter into the lower end portion of the housing 50. As illustrated in FIG. 22, connectors 296 (a connection section) to electrically connect the circuit board 101 that is housed inside the housing 50 to outer wiring is provided in plurality in the lid 290.

Heat Pipe 240

Figure 23:
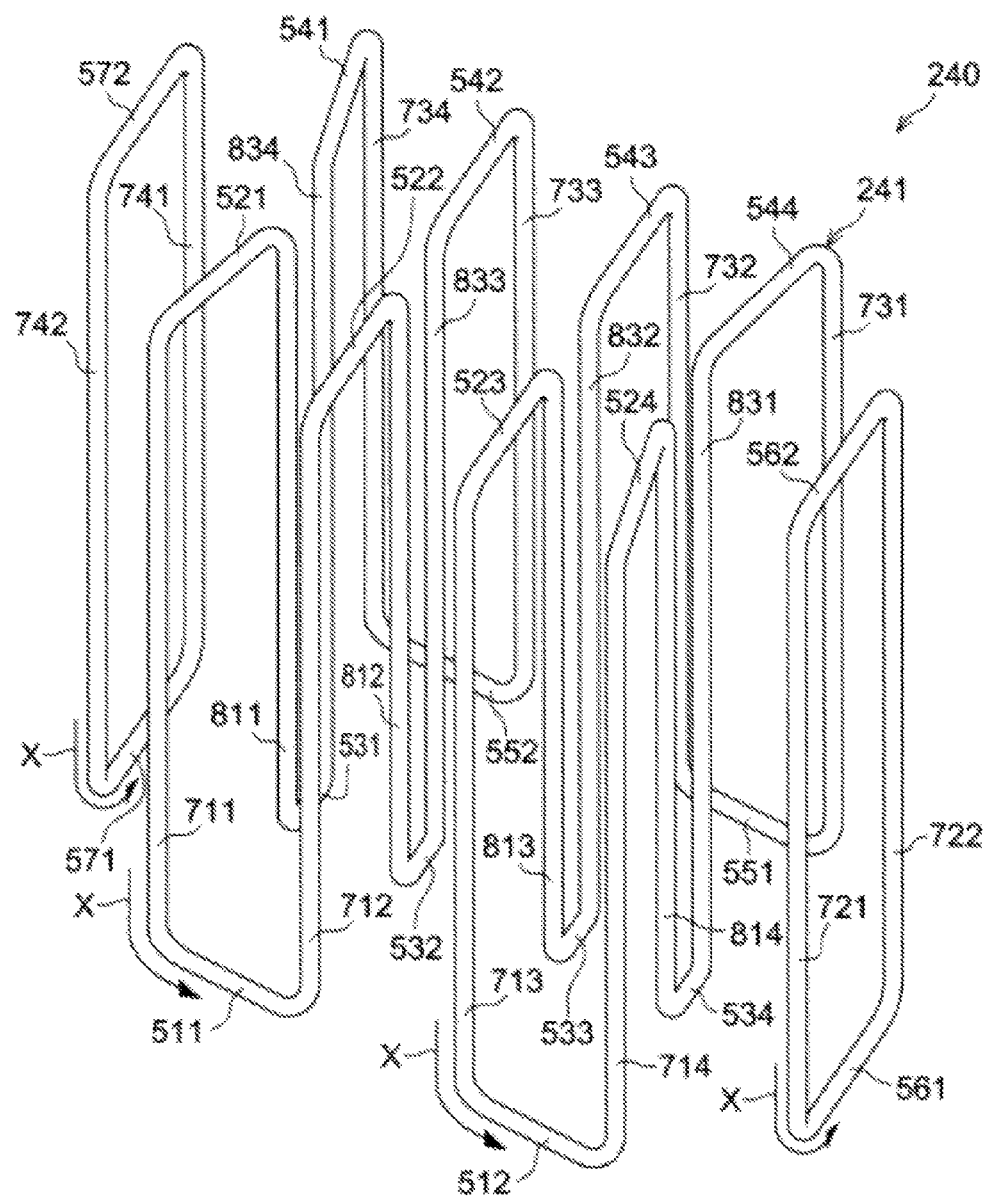
FIG. 23 is a perspective view of a heat pipe according to the second embodiment.

The heat pipe 240 includes, as illustrated in FIG. 23, similar to the heat pipe 40, a pipe 241, and the heat medium 49 that is filled in the pipe 241 (see FIG. 7). A fluid such as pure water is used as the heat medium 49. The pipe 241 includes, as illustrated in FIG. 23, four paths (circulating paths) through which the heat medium 49 circulates. Specifically, the pipe 241 includes linear sections 711, 712, 713, and 714 (hereinafter, indicated as 711 to 714), linear sections 721 and 722, linear sections 731, 732, 733, and 734 (hereinafter, indicated as 731 to 734), and linear sections 741 and 742. The heat pipe 240 includes linear sections 811, 812, 813, and 814 (hereinafter, indicated as 811 to 814), and linear sections 831, 832, 833, and 834 (hereinafter, indicated as 831 to 834). The respective linear sections 711 to 714, 721, 722, 731 to 734, 741, 742, 811 to 814, and 831 to 834 are formed linearly along the axial direction.

The heat pipe 240 includes joining sections 511 and 512, joining sections 521, 522, 523, and 524 (hereinafter, indicated as 521 to 524), and joining sections 531, 532, 533, and 534 (hereinafter, indicated as 531 to 534). The heat pipe 240 includes joining sections 541, 542, 543, and 544 (hereinafter, indicated as 541 to 544), joining sections 551 and 552, joining sections 561 and 562, and joining sections 571 and 572.

At least a part of each of the joining sections 511, 512, 521 to 524, 531 to 534, 541 to 544, 551, 552, 561, 562, 571, and 572 is curved. The respective joining sections 511, 512, 521 to 524, 531 to 534, 541 to 544, 551, 552, 561, 562, 571, and 572 cause the heat medium 49 to circulate in the outer sides of the housing 50 and the inner tube 210. This allows heat to be released in the air also from the respective joining sections 511, 512, 521 to 524, 531 to 534, 541 to 544, 551, 552, 561, 562, 571, and 572.

The linear sections 711 to 714 (an example of the first circulation section) and the joining sections 511 and 512 are disposed to the first side plate 11 of the housing 50. Specifically, each of the linear sections 711 to 714 is inserted into each of the insertion holes 24 in the first side plate 11. With this, the respective linear sections 711 to 714 cause the heat medium 49 to circulate in a direction orthogonal to the thickness direction of the first side plate 11. The joining section 511 joins a lower end portion of the linear section 711 and a lower end portion of the linear section 712, below the first side plate 11. The joining section 512 joins a lower end portion of the linear section 713 and a lower end portion of the linear section 714, below the first side plate 11.

The linear sections 731 to 734 (an example of the first circulation section) and the joining sections 551 and 552 are disposed to the third side plate 13 of the housing 50. Specifically, each of the linear sections 731 to 734 is inserted into each of the insertion holes 24 in the third side plate 13. With this, the respective linear sections 731 to 734 cause the heat medium 49 to circulate in a direction orthogonal to the thickness direction of the third side plate 13. The joining section 551 joins a lower end portion of the linear section 731 and a lower end portion of the linear section 732, below the third side plate 13. The joining section 552 joins a lower end portion of the linear section 733 and a lower end portion of the linear section 734, below the third side plate 13.

The linear sections 811 to 814 (an example of the second circulation section) are disposed to the first side plate 211 of the inner tube 210. Specifically, each of the linear sections 811 to 814 is inserted into each of the insertion holes 24 in the first side plate 211. With this, the respective linear sections 811 to 814 cause the heat medium 49 to circulate in a direction orthogonal to the thickness direction of the first side plate 211.

The linear sections 831 to 834 (an example of the second circulation section) are disposed to the third side plate 213 of the inner tube 210. Specifically, each of the linear sections 831 to 834 is inserted into each of the insertion holes 24 in the third side plate 213. With this, the respective linear sections 831 to 834 cause the heat medium 49 to circulate in a direction orthogonal to the thickness direction of the third side plate 213.

Lower end portions of the linear sections 811 to 814 are respectively joined to lower end portions of the linear sections 831 to 834 with the respective joining sections 531 to 534. Upper end portions of the linear sections 811 to 814 are respectively joined to upper end portions of the linear sections 711 to 714 with the respective joining sections 521 to 524. Upper end portions of the linear sections 831 to 834 are respectively joined to upper end portions of the linear sections 731 to 734 with the respective joining sections 541 to 544.

Further, the respective linear sections 711 to 714, 721, 722, 731 to 734, 741, 742, 811 to 814, and 831 to 834 that are inserted into the respective insertion holes 24 are bonded to both of the housing 50 and the inner tube 210 by a method such as heating pipe-enlarging, hot joining, and soldering, for example.

In the heat pipe 240, the respective linear sections 711, 712, 811, 812, 733, 734, 833, and 834 are joined to one another with the respective joining sections 511, 521, 522, 531, 532, 541, 542, and 552 to form a continuous path (circulating path). Moreover, the respective linear sections 713, 714, 813, 814, 731, 732, 831, and 832 are joined to one another with the respective joining sections 512, 523, 524, 533, 534, 543, 544, and 551 to form a continuous path (circulating path). In each of the two circulating paths, the heat medium 49 passes through the first side plate 11 and the third side plate 13 of the housing 50, and the first side plate 211 and the third side plate 213 of the inner tube 210. The heat medium 49 circulates in an arrow X direction, for example.

Moreover, the linear sections 721 and 722 are joined to each other with the respective joining sections 561 and 562 to form a continuous path (circulating path). Moreover, the linear sections 741 and 742 are joined to each other with the respective joining sections 571 and 572 to form a continuous path (circulating path). In this manner, in the heat pipe 240, the four paths are formed.

The heat pipe 240 has a function to transfer heat from a high-temperature section (heating section) to a low-temperature section (cooling section). In the present embodiment, the first side plate 11 and the third side plate 13 with which the circuit boards 101 and 103 come into contact serve as the high-temperature section. In contrast, the first side plate 211 and the third side plate 213 of the inner tube 210 with which the circuit boards 101 and 103 come into contact serve as the low-temperature section.

In the heat pipe 240, the heat medium 49 vaporizes in the linear sections 711 to 714 and 731 to 734 due to the heat of the first side plate 11 and the heat of the third side plate 13. In this process, the vaporized latent heat is derived from the first side plate 11 and the third side plate 13. The vaporized heat medium 49 circulates in the linear sections 811 to 814 that are disposed to the first side plate 211 of the inner tube 210, and the linear sections 831 to 834 that are disposed to the third side plate 213 of the inner tube 210, through the heat pipe 240.

Further, the vaporized heat medium 49 in the linear sections 811 to 814 and the linear sections 831 to 834 releases heat to the first side plate 211 and the third side plate 213 of the inner tube 210. This condenses the heat medium 49. In this manner, the heat medium 49 circulates to conduct the heat of the first side plate 11 and the heat of the third side plate 13 to the inner tube 210, the first side plate 11 and the third side plate 13 respectively coming into contact with the circuit boards 101 and 103.

Moreover, the heat medium 49 also circulates in the second side plate 12 and the fourth side plate 14 of the housing 50 to conduct heat between the low-temperature section and the high-temperature section.

Effect by Second Embodiment

An effect by the second embodiment will be described.

In the second embodiment, the circuit board 101 that is disposed to the first side plate 11 generates heat. This allows part of the heat of the circuit board 101 to be conducted to the first side plate 11. Moreover, the circuit board 103 that is disposed to the third side plate 13 generates heat. This allows part of the heat of the circuit board 103 to be conducted to the third side plate 13.

The parts of the heat having been conducted to the first side plate 11 and the third side plate 13 are released from the heat dissipation fins 30 that are respectively formed on the first side plate 11 and the third side plate 13. Moreover, the part of the heat having been conducted to the first side plate 11 is directly conducted to the second side plate 12 and the fourth side plate 14 through the joining portion between the first side plate 11 and the second side plate 12 and the joining portion between the first side plate 11 and the fourth side plate 14.

The part of the heat having been conducted to the third side plate 13 is directly conducted to the second side plate 12 and the fourth side plate 14 through the joining portion between the third side plate 13 and the second side plate 12 and the joining portion between the third side plate 13 and the fourth side plate 14.

In addition, the heat medium 49 vaporizes in the linear sections 711 to 714 and 731 to 734 of the heat pipe 240 due to the parts of the heat having been conducted to the first side plate 11 and the third side plate 13. In this process, the vaporized latent heat is derived from the first side plate 11 and the third side plate 13. The vaporized heat medium 49 circulates in the linear sections 811 to 814 and 831 to 834 that are disposed to the inner tube 210, through the joining sections 522 and 524 and joining sections 541 and 543.

Further, the vaporized heat medium 49 in the linear sections 811 to 814 and 831 to 834 releases heat to the first side plate 211 and the third side plate 213 of the inner tube 210. This condenses the heat medium 49. The heat having been released to the first side plate 211 and the heat having been released to the third side plate 213 are released from the heat dissipation fins 230 that are respectively formed on the first side plate 211 and the third side plate 213.

In this manner, the heat of the circuit board 101 and the heat of the circuit board 103 are not only directly conducted to the second side plate 12 and the fourth side plate 14 from the first side plate 11 and the third side plate 13, respectively, but also conducted to the first side plate 211 and the third side plate 213 of the inner tube 210, through the heat pipe 240.

This reduces a difference in temperature between the housing 50 and the inner tube 210, compared with a structure having no heat pipe 240. This reduces a difference between the amount of heat dissipation from the heat dissipation fins 30 in the housing 50 and the amount of heat dissipation from the heat dissipation fins 230 in the inner tube 210. In other words, the heat dissipation fins 230 in the inner tube 210 that do not come into contact with the circuit boards 101 and 103 also exhibit a heat dissipation function, similar to the heat dissipation fins 30 in the housing 50. This improves the heat dissipation efficiency to release the heat of the circuit board 101 and the heat of the circuit board 103.

Modification of Second Embodiment

A modification of the second embodiment will be described.

Figure 24:
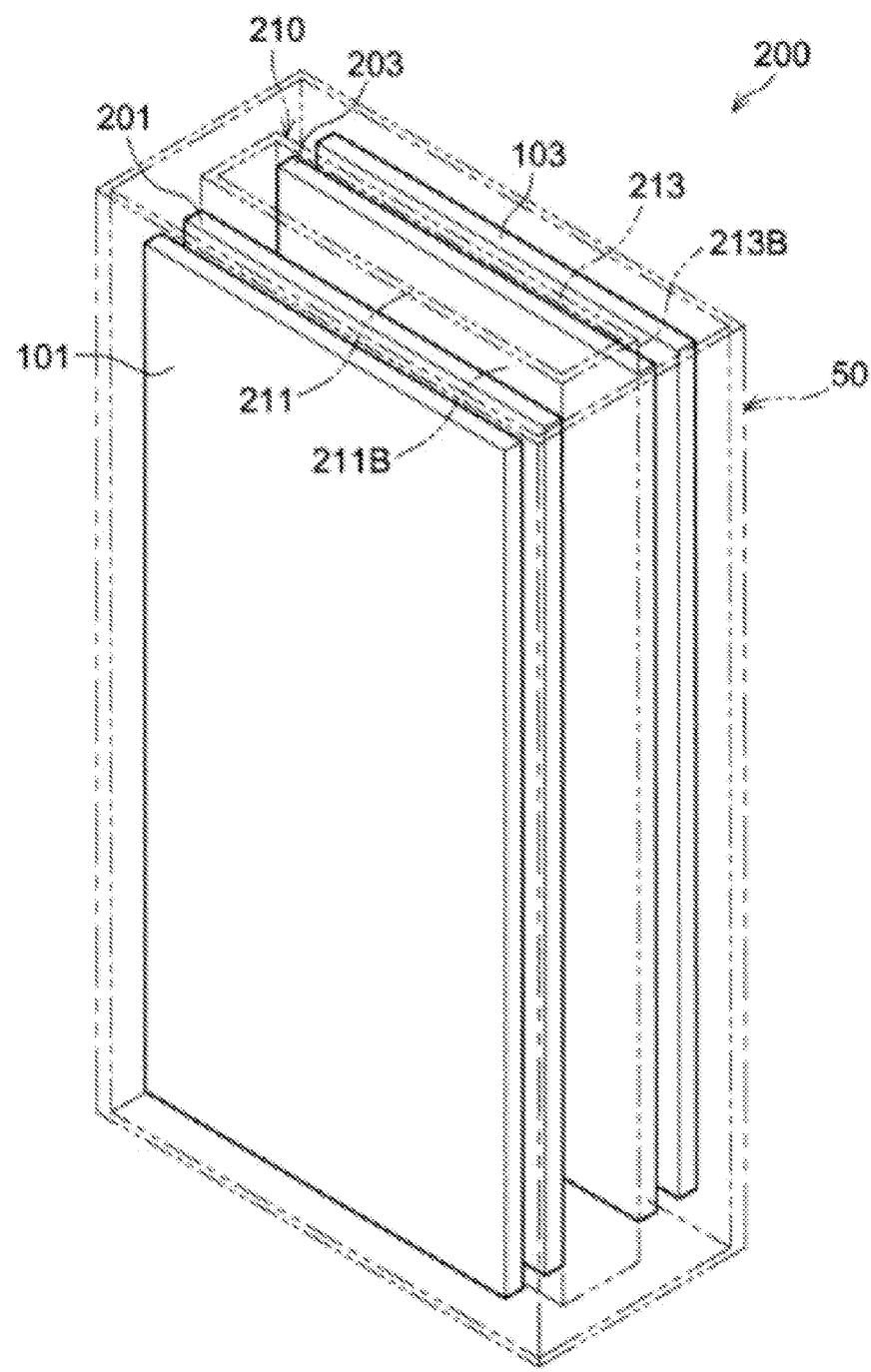
FIG. 24 is perspective view illustrating a modification of the base station device in FIG. 20.

The base station device 200 may include, as illustrated in FIG. 24, circuit boards 201 and 203 (an example of a heat source, an example of a heat-generating element) having heat-generating elements, in addition to the circuit boards 101 and 103. The circuit boards 201 and 203 come into contact with outer surfaces 211B and 213B on the first side plate 211 and the third side plate 213 of the inner tube 210, for example. In this structure, heat is conducted, out of the circuit boards 101, 103, 201, and 203, from a side plate that comes into contact with a circuit board with a large amount of heat generation to a side plate that comes into contact with a circuit board with a small amount of heat generation, through the heat pipe 240. Further, the base station device 200 may include at least one circuit board out of the circuit boards 101, 103, 201, and 203.

Moreover, the path of the heat pipe is not limited to the path of the heat pipe 240 illustrated in FIG. 23, but various paths may be used.

Third Embodiment

Figure 25:
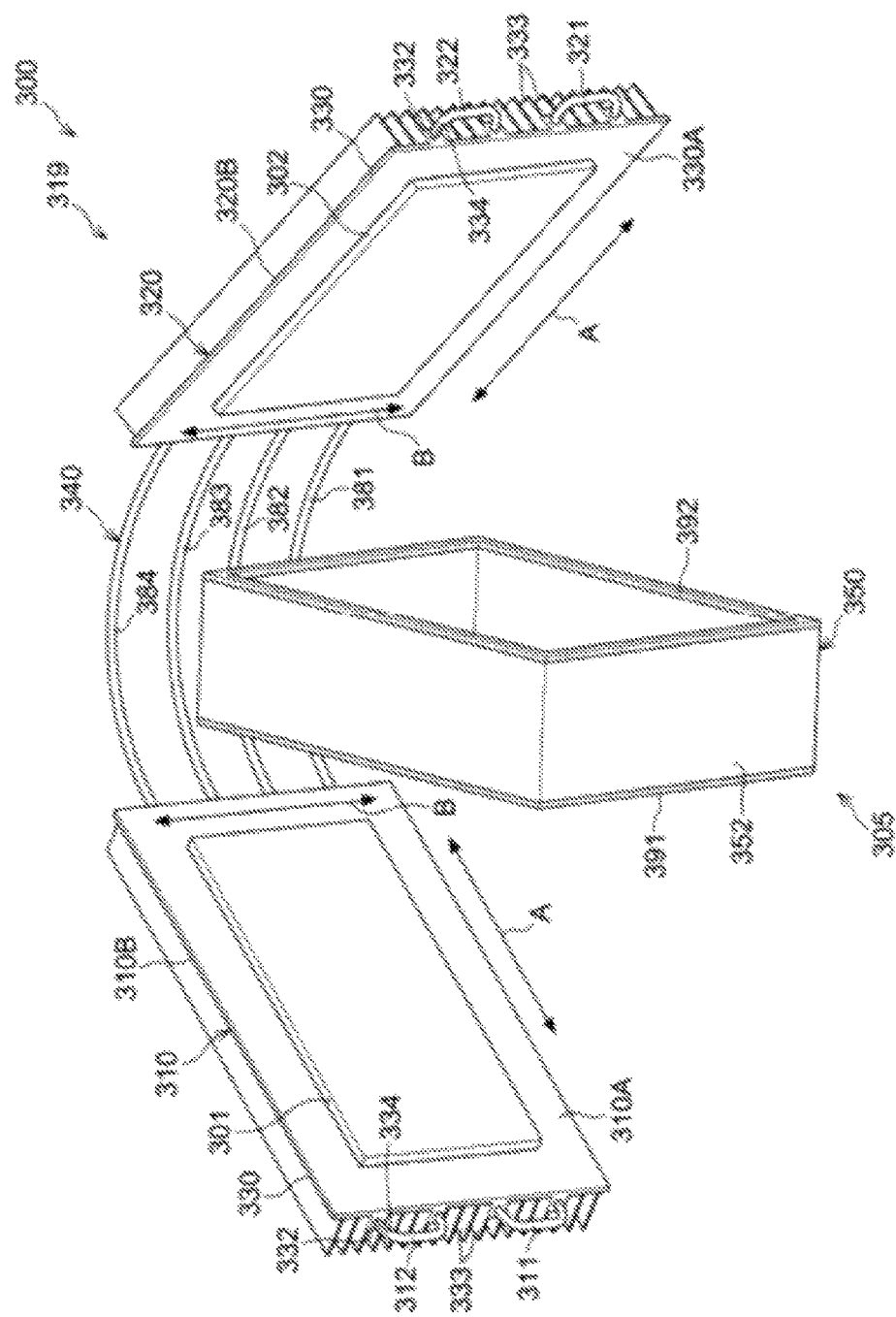
FIG. 25 is an exploded perspective view of a base station device according to a third embodiment.

Next, a base station device 300 according to a third embodiment will be described. FIG. 25 is a perspective view illustrating the base station device 300 according to the third embodiment. Note that, the same reference numerals are assigned to the portions with the same structure as the first embodiment, and explanations thereof are omitted as appropriate.

The base station device 300 is provided with, as illustrated in FIG. 25, a housing 305, a heat pipe 340, and circuit boards 301 and 302 (an example of a heat source, an example of a heat-generating element) having heat-generating elements. The housing 305 of the base station device 300 is provided with a tube body 350, a first side plate 310, and a second side plate 320. In the base station device 300, heat generated from the circuit board 301 and heat generated from the circuit board 302 are released by the first side plate 310, the second side plate 320, and the heat pipe 340. In other words, the base station device 300 is provided with a heat dissipation device (heat dissipation structure) 319 including the first side plate 310, the second side plate 320, and the heat pipe 340. Hereinafter, specific structures of the tube body 350, the first side plate 310, the second side plate 320, and the heat pipe 340 will be described. Note that, an explanation is made hereinafter by assuming that the amount of heat generation from the circuit board 301 is more than the amount of heat generation from the circuit board 302.

Tube Body 350

The tube body 350 is specifically a rectangular tube having four side walls 352. The tube body 350 has open shaft-direction both ends.

The first side plate 310 is attached to an axial end of the tube body 350. This closes the one axial end of the tube body 350. A sealing member (gasket) 391 is interposed into a part between the one axial end of the tube body 350 and the first side plate 310. This seals the part between the one axial end of the tube body 350 and the first side plate 310. Sealing the part between the one axial end of the tube body 350 and the first side plate 310 restricts rainwater or dust to enter into the one axial end of the tube body 350.

The second side plate 320 is attached to the axial other end of the tube body 350. This closes the axial other end of the tube body 350. A sealing member (gasket) 392 is interposed into a part between the axial other end of the tube body 350 and the second side plate 320. This seals the part between the axial other end of the tube body 350 and the second side plate 320. Sealing the part between the axial other end of the tube body 350 and the second side plate 320 restricts rainwater or dust to enter into the axial other end of the tube body 350.

The tube body 350 is formed of a metal material such as aluminum, for example. Further, the tube body 350 may be formed of a resin material. Examples of a molding method of the tube body 350 include die-cast molding, injection molding, or the like, for example.

First Side Plate 310 and Second Side Plate 320

Each of the first side plate 310 and the second side plate 320 includes, a base plate 330, and projection sections 332 that are provided in plurality with intervals on an outer surface of the base plate 330.

The projection sections 332 protrude outward from the outer surface of the base plate 330. The projection sections 332 are provided to be extended along A directions in the first side plate 310 and the second side plate 320. Moreover, the projection sections 332 are disposed in plurality with intervals along B directions on the first side plate 310 and the second side plate 320. Four projection sections 332, for example, are respectively disposed to the first side plate 310 and the second side plate 320.

Insertion holes 334 into which the heat pipe 340 is inserted are formed in the projection sections 332. The insertion hole 334 penetrates through the projection section 332 along the A direction.

The circuit boards 301 and 302 are respectively attached to an inner surface 310A of the first side plate 310 and an inner surface 320A of the second side plate 320. This causes the circuit boards 301 and 302 to respectively come into contact with the first side plate 310 and the second side plate 320, whereby heat of the circuit board 301 and the heat of the circuit board 302 are respectively conducted to the first side plate 310 and the second side plate 320. Further, each of the inner surface 310A of the first side plate 310 and the inner surface 320A of the second side plate 320 is formed in a planar shape.

Multiple heat dissipation fins 333 are respectively formed on an outer surface 310B of the first side plate 310 and an outer surface 320B of the second side plate 320. Each of the heat dissipation fins 333 is formed along the A direction. The multiple heat dissipation fins 333 are disposed along the B direction.

Further, the first side plate 310 and the second side plate 320 are formed by extrusion molding, for example. The first side plate 310 and the second side plate 320 are formed of a metal material such as aluminum.

Heat Pipe 340

Figure 26:
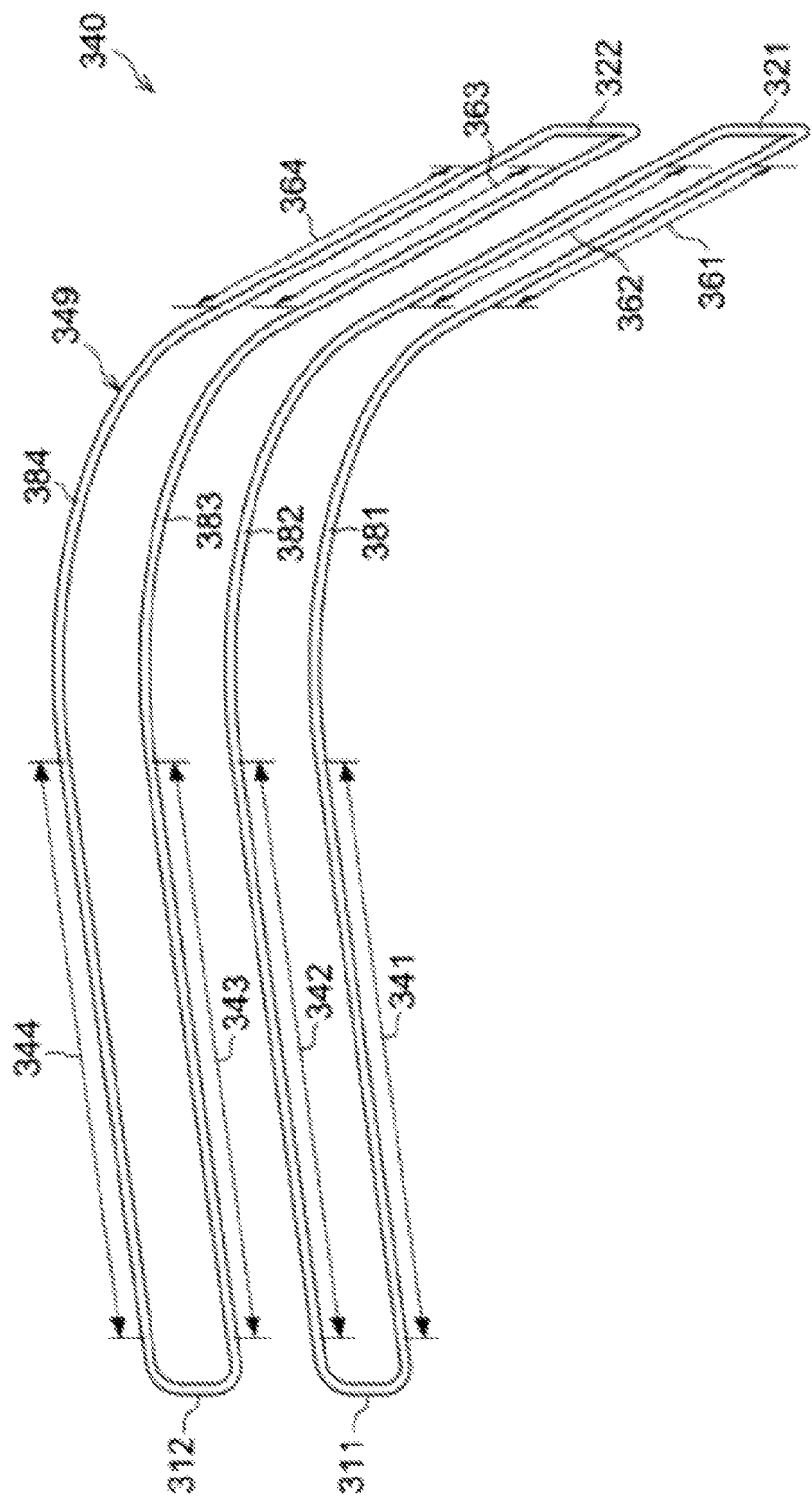
FIG. 26 is a perspective view of a heat pipe according to the third embodiment.

The heat pipe 340 includes, as illustrated in FIG. 26, similar to the heat pipe 40, a pipe 349, and the heat medium 49 that is filled in the pipe 349 (see FIG. 7). A fluid such as pure water is used as the heat medium 49. The pipe 349 includes, as illustrated in FIG. 26, two paths (circulating paths) through which the heat medium 49 circulates. Specifically, the pipe 349 includes linear sections 341, 342, 343, and 344 (hereinafter, indicated as linear sections 341 to 344), and linear sections 361, 362, 363, and 364 (hereinafter, indicated as the linear section 361 to 364). The linear sections 341 to 344 and the linear sections 361 to 364 are formed linearly along the A direction.

The heat pipe 340 includes joining sections 311 and 312, joining sections 321 and 322, and joining sections 381, 382, 383, and 384 (hereinafter, indicated as joining section 381 to 384). At least a part of each of the joining sections 311 and 312, the joining sections 321 and 322, and the joining section 381 to 384 is curved. The joining sections 311, 312, 321, 322, and 381 to 384 cause the heat medium 49 to circulate in the outer sides of the first side plate 310 and the second side plate 320. This allows heat to be released in the air also from the joining sections 311, 312, 321, 322, and 381 to 384.

The linear sections 341 to 344 (an example of the first circulation section) and the joining sections 311 and 312 are disposed to the first side plate 310. Specifically, each of the linear sections 341 to 344 is inserted into each of the insertion holes 334 in the first side plate 310. With this, the respective linear sections 341 to 344 cause the heat medium 49 to circulate in a direction orthogonal to the thickness direction of the first side plate 310. The joining section 311 joins, at one end side in the A direction of the first side plate 310, one end portion in the A direction of the linear section 341 and one end portion in the A direction of the linear section 342. The joining section 312 joins, at the one end side in the A direction of the first side plate 310, one end portion in the A direction of the linear section 343 and one end portion in the A direction of the linear section 344.

The linear sections 361 to 364 (an example of the first circulation section) and the joining sections 321 and 322 are disposed to the second side plate 320. Specifically, each of the linear sections 361 to 364 is inserted into each of the insertion holes 334 in the second side plate 320. With this, the respective linear sections 361 to 364 cause the heat medium 49 to circulate in a direction orthogonal to the thickness direction of the second side plate 320. The joining section 321 joins, at one end side in the A direction of the second side plate 320, one end portion in the A direction of the linear section 361 and one end portion in the A direction of the linear section 362. The joining section 322 joins, at the one end side in the A direction of the second side plate 320, one end portion in the A direction of the linear section 363 and one end portion in the A direction of the linear section 364.

In addition, the joining section 381 joins the other end portion in the A direction of the linear section 341 and the other end portion in the A direction of the linear section 361. The joining section 382 joins the other end portion in the A direction of the linear section 342 and the other end portion in the A direction of the linear section 362. The joining section 383 joins the other end portion in the A direction of the linear section 343 and the other end portion in the A direction of the linear section 363. The joining section 384 joins the other end portion in the A direction of the linear section 344 and the other end portion in the A direction of the linear section 364.

Further, the respective linear sections 341 to 344 and the respective linear sections 361 to 364 that are inserted into the respective insertion holes 334 are respectively bonded to the first side plate 310 and the second side plate 320 by a method such as heating pipe-enlarging, hot joining, and soldering, for example.

In the heat pipe 340, the linear sections 341 and 342 and the linear sections 361 and 362 are joined to one another with the joining section 311, the joining section 321, and the joining sections 381 and 382 to form a continuous path (circulating path). Moreover, the linear sections 343 and 344 and the linear sections 363 and 364 are joined to one another with the joining section 312, the joining section 322, and the joining sections 383 and 384 to form a continuous path (circulating path). Further, in the heat pipe 40, the heat medium 49 passes through the first side plate 310 and the second side plate 320 in the respective paths. In other words, the heat medium 49 circulates between the first side plate 310 and the second side plate 320.

The heat pipe 340 has a function to transfer heat from a high-temperature section (heating section) to a low-temperature section (cooling section). In the present embodiment, the first side plate 310 that comes into contact with the circuit board 301 with the relative large amount of heat generation serves as the high-temperature section. In contrast, the second side plate 320 that comes into contact with the circuit board 302 with the relative small amount of heat generation serves as the low-temperature section.

In the heat pipe 340, the heat medium 49 vaporizes in the linear sections 341 to 344 due to the heat of the first side plate 310. In this process, the vaporized latent heat is derived from the first side plate 310. The vaporized heat medium 49 circulates in the linear sections 361 to 364 that are disposed to the second side plate 320, through the heat pipe 340. Further, the vaporized heat medium 49 in the linear sections 361 to 364 releases heat to the second side plate 320. This condenses the heat medium 49. In this manner, the heat medium 49 circulates to conduct the heat of the first side plate 310 that comes into contact with the circuit board 301 to the second side plate 320.

Effect by Third Embodiment

An effect by the third embodiment will be described.

In the third embodiment, the circuit board 301 that is disposed to the inner surface 310A of the first side plate 310 generates heat. This allows part of the heat of the circuit board 301 to be conducted to the first side plate 310. Moreover, the circuit board 302 that is disposed to the inner surface 320A of the second side plate 320 generates heat. This allows part of the heat of the circuit board 302 to be conducted to the second side plate 320. Further, the amount of heat generation from the circuit board 302 is smaller than the amount of heat generation from the circuit board 301, whereby the temperature at the second side plate 320 becomes lower than that at the first side plate 310.

Part of the heat having been conducted to the first side plate 310 and part of the heat having been conducted to the second side plate 320 are released from the heat dissipation fins 333 that respectively formed on the first side plate 310 and the second side plate 320. Moreover, part of the heat having been conducted to the first side plate 310 causes the heat medium 49 to vaporize in the linear sections 341 to 344 of the heat pipe 340. In this process, the vaporized latent heat is derived from the first side plate 310. The vaporized heat medium 49 circulates in the linear sections 361 to 364 that are disposed to the second side plate 320 lower in temperature than the first side plate 310, through the joining section 381 to 384.

Further, the vaporized heat medium 49 in the linear sections 361 to 364 releases heat to the second side plate 320. This condenses the heat medium 49. The heat having been released to the second side plate 320 is released from the heat dissipation fins 333 that are formed on the second side plate 320.

In this manner, the heat of the circuit board 301 is conducted to the second side plate 320 through the heat pipe 340. This reduces a difference between the temperature at the first side plate 310 and the temperature at the second side plate 320, compared with a structure having no heat pipe 340. This reduces a difference between the amount of heat dissipation from the heat dissipation fins 333 on the first side plate 310 and the amount of heat dissipation from the heat dissipation fins 333 on the second side plate 320. In other words, the heat dissipation fins 333 on the second side plate 320 exhibits a heat dissipation function, similar to the heat dissipation fins 333 on the first side plate 310. This improves the heat dissipation efficiency to release the heat of the circuit board 301.

Further, the path of the heat pipe 340 is not limited to the path illustrated in FIG. 26, but various paths may be used. Moreover, the base station device 300 may include at least one circuit board out of the circuit boards 301 and 302.

Modifications of Embodiments

Modifications of embodiments will be described.

As illustrated in FIGS. 27 to 30, the heat pipes 40, 140, 240, and 340 (hereinafter, indicated as 40 to 340) described above may include a reserve tank 47 serving as a storage unit.

Figure 27:
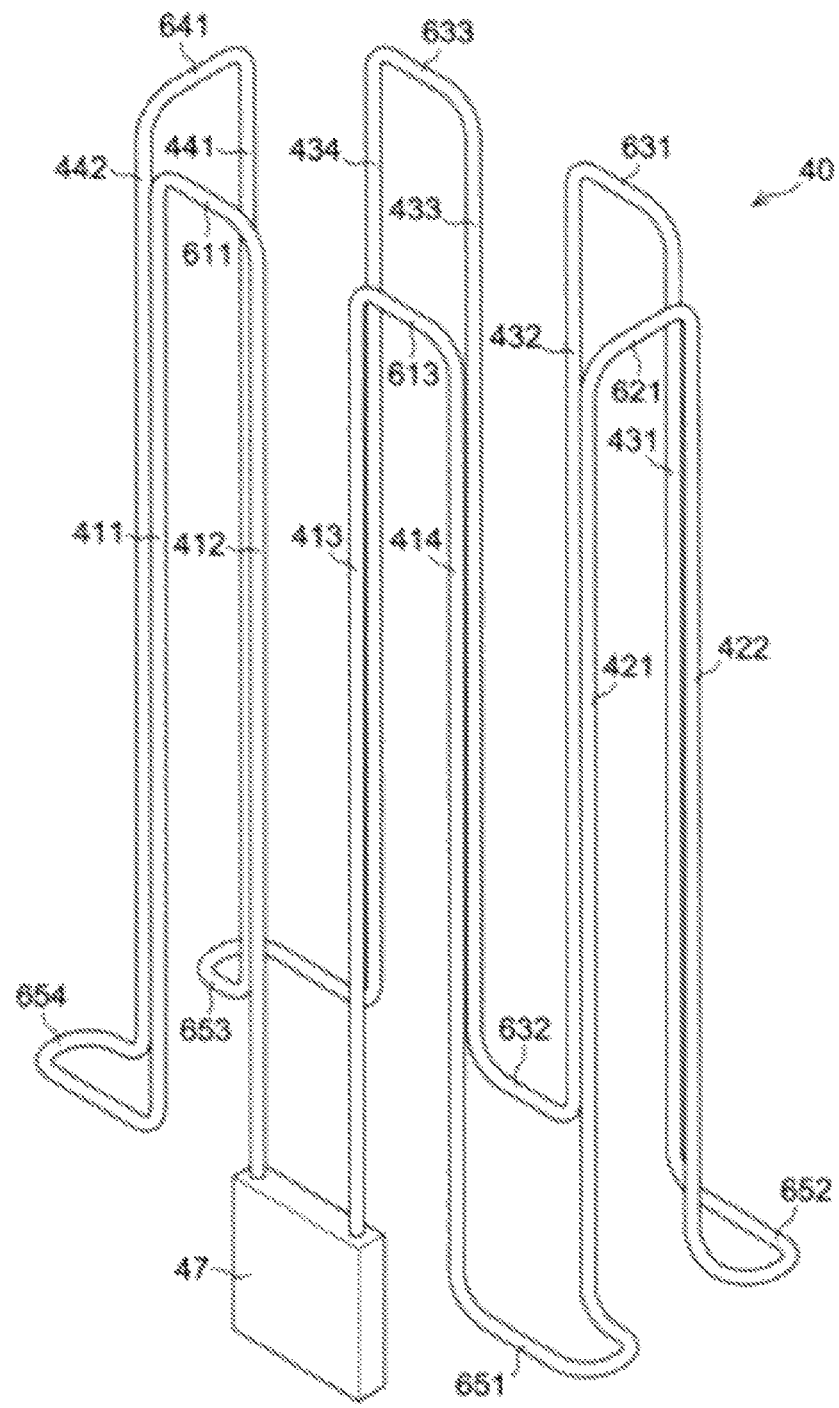
FIG. 27 is a perspective view illustrating a modification of the heat pipe in FIG. 6.
Figure 28:
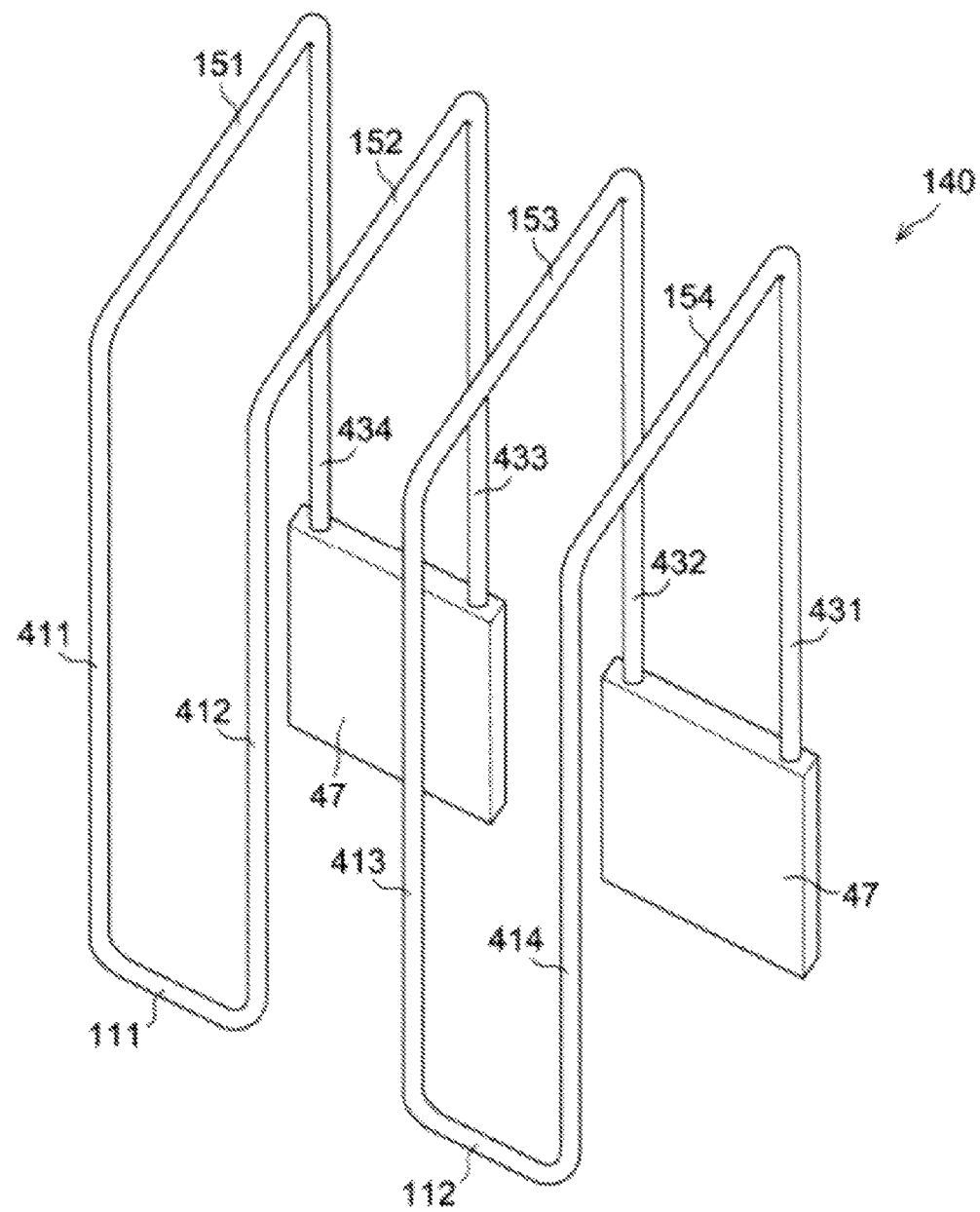
FIG. 28 is a perspective view illustrating a modification of the heat pipe in FIG. 17.

In the heat pipe 40, as illustrated in FIG. 27, for example, the reserve tank 47, instead of the joining section 612 (see FIG. 6), is connected to the linear sections 412 and 413. In the heat pipe 140, as illustrated in FIG. 28, for example, the reserve tanks 47, instead of the joining sections 131 and 132 (see FIG. 17), are respectively connected to the linear sections 431 and 432 and the linear section 433 and 434.

Figure 29:
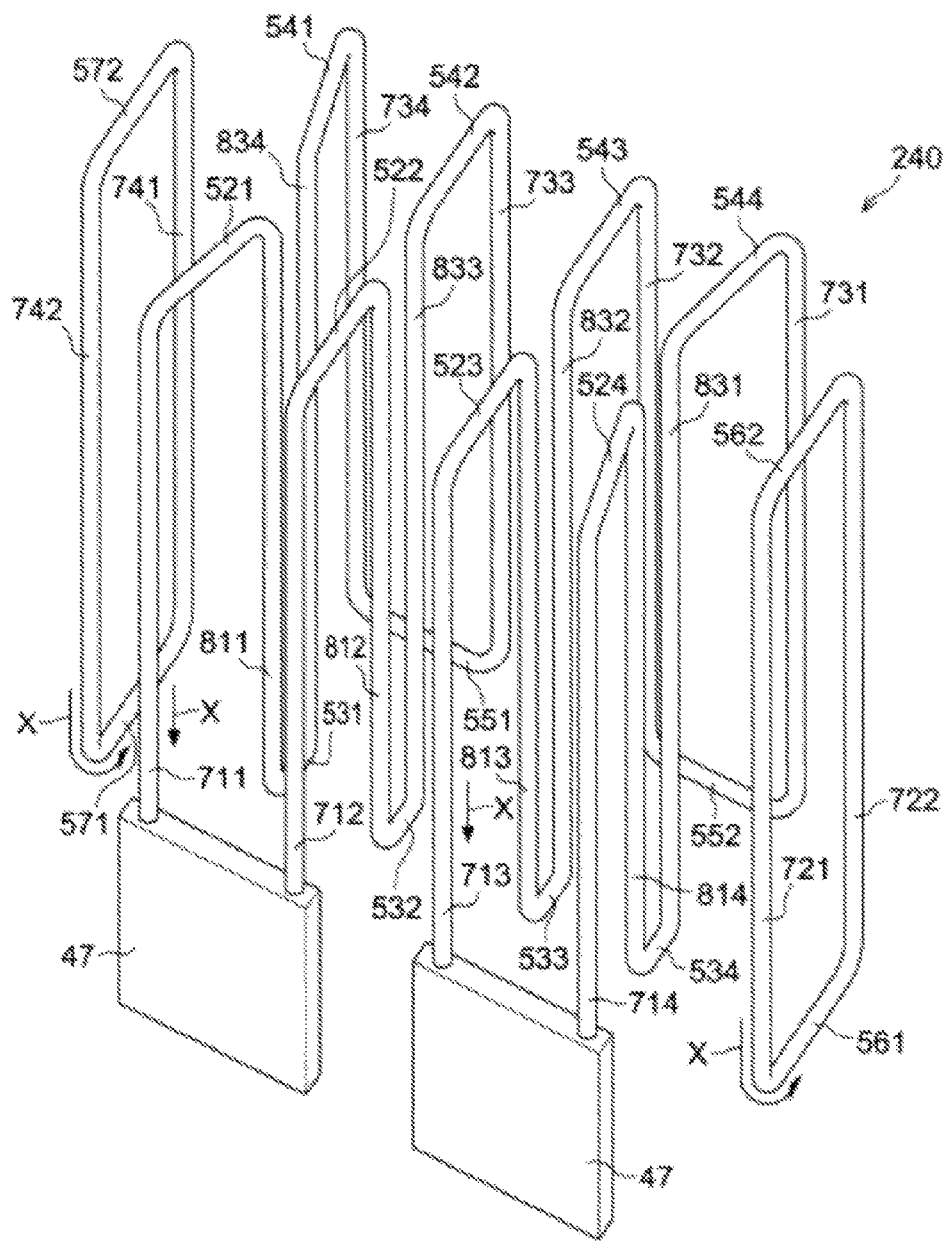
FIG. 29 is a perspective view illustrating a modification of the heat pipe in FIG. 23.
Figure 30:
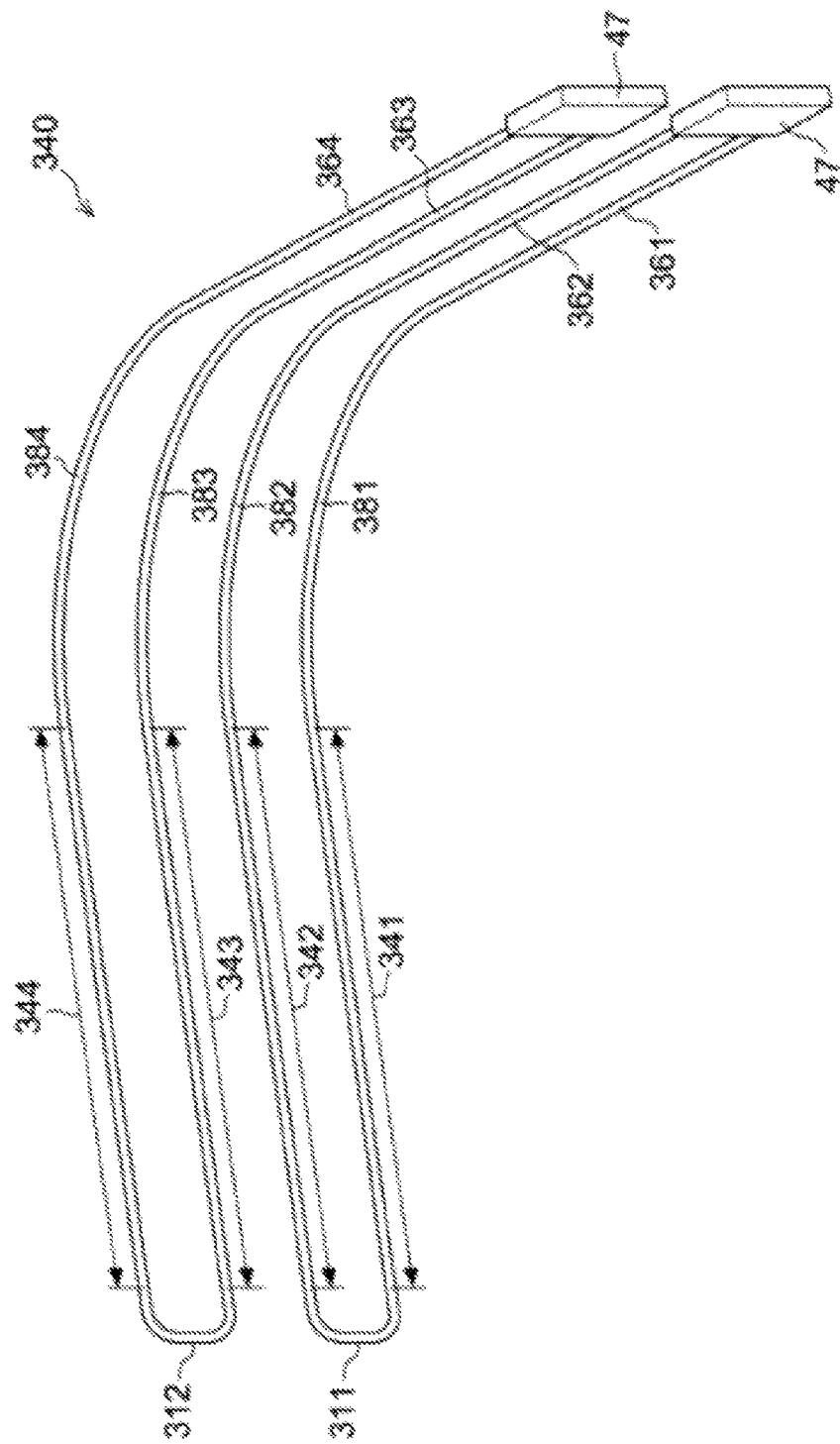
FIG. 30 is a perspective view illustrating a modification of the heat pipe in FIG. 26.

In the heat pipe 240, as illustrated in FIG. 29, for example, the reserve tanks 47, instead of the joining sections 511 and 512 (see FIG. 23), are respectively connected to the linear sections 711 and 712 and the linear sections 713 and 714. In the heat pipe 340, as illustrated in FIG. 30, for example, the reserve tanks 47, instead of the joining sections 321 and 322 (see FIG. 26), are respectively connected to the linear sections 361 and 362 and the linear sections 363 and 364.

The reserve tank 47 has a function to temporarily storage the heat medium 49 in the heat pipes 40 to 340. Moreover, the reserve tank 47 temporarily stores therein the heat medium 49 to restrict the pressure in the heat pipes 40 to 340 to be abnormality raised. In addition, the reserve tank 47 may have a function to separate the gas-phase heat medium 49 and the liquid-phase heat medium 49 from each other in the heat pipes 40 to 340.

Figure 31:
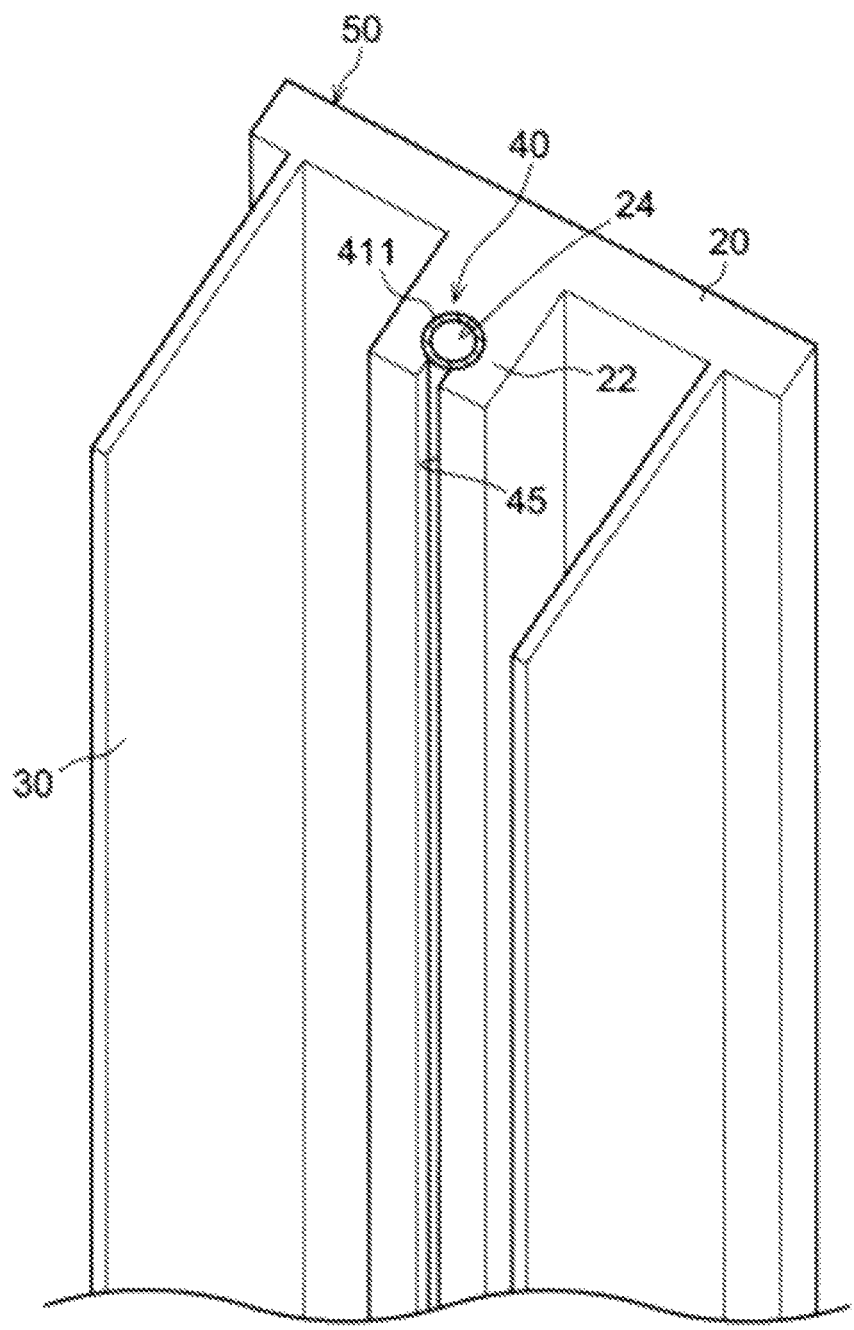
FIG. 31 is a perspective view illustrating a modification of an insertion hole.

Moreover, in the heat pipe 40, the linear section 411 or the like is inserted into the insertion hole 24 in the axial direction (A direction), however, the embodiment is not limited to this structure. For example, as illustrated in FIG. 31, a slit 45 may be provided at the outer side in the radial direction of the insertion hole 24. This structure allows the linear sections 411 to 414 or the like to be installed by forcedly broadening the slits 45. Note that, the similar structure may be employed also in the heat pipes 140, 240, and 340.

Figure 32:
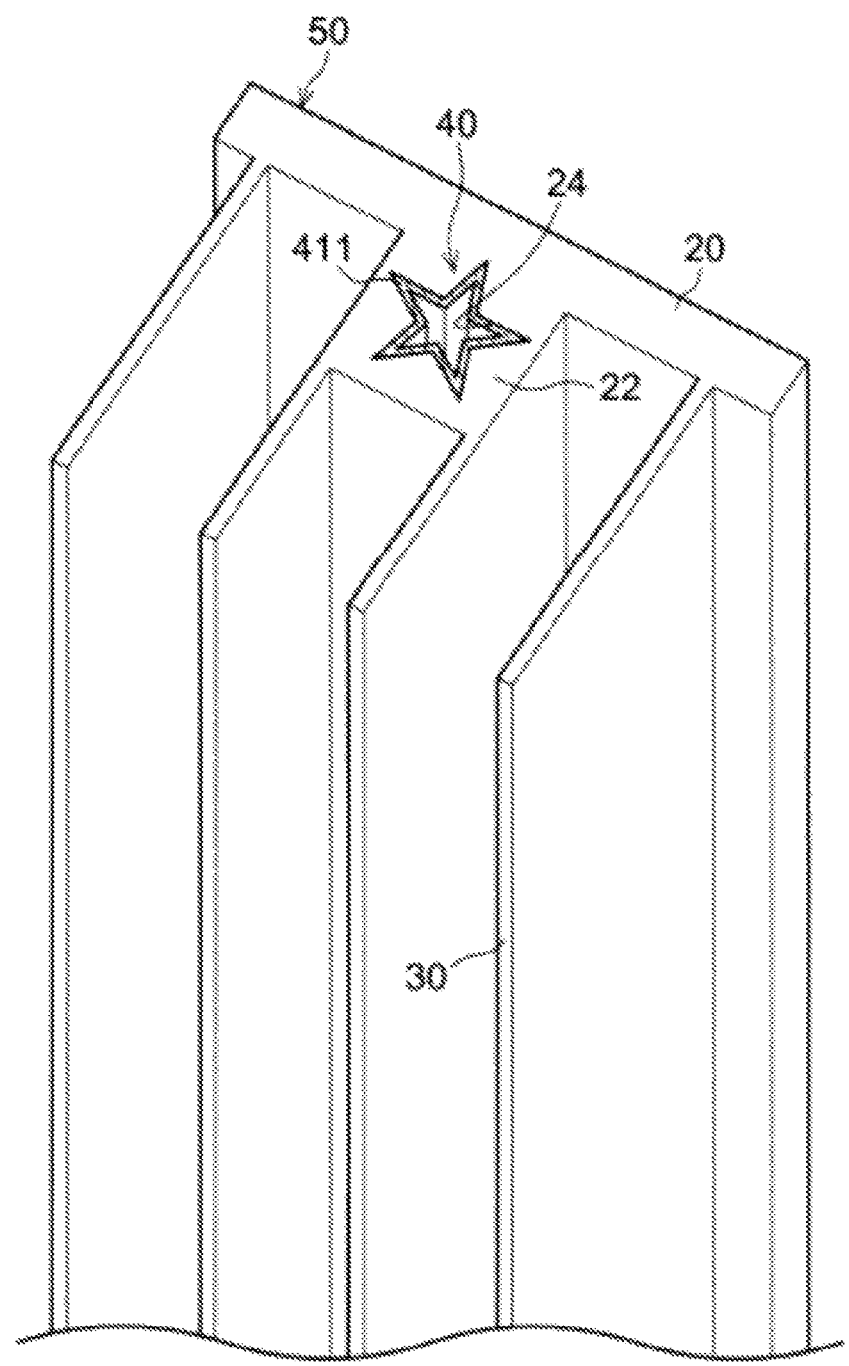
FIG. 32 is a perspective view illustrating a modification of a cross-sectional shape of the heat pipe.

Moreover, in the heat pipe 40, the linear section 411 and the like are circular pipes, however, the embodiment is not limited to this structure. As illustrated in FIG. 32, for example, the linear section 411 and the like may have a star shape in cross section. This increases a contact area with the housing 50, so that the heat is efficiently conducted between the housing 50 and the heat pipe 40. Further, the shape that allows the increased contact area is not limited to the star shape in cross section, but various shapes may be used as long as the shape is non-circular. Note that, the similar structure may be employed also in the heat pipes 140, 240, and 340.

Moreover, in the heat pipe 40, the linear sections 411 to 414 and the like are inserted into the insertion holes 24, however, the embodiment is not limited to this structure. The heat medium 49 is directly enclosed in the insertion hole 2 to form the heat pipe 40. Note that, the similar structure may be employed also in the heat pipes 140, 240, and 340.

Moreover, the heat source is not limited to the circuit board, but the heat source may be a heat-generating element that a generates heat.

The electronic device is not limited to the base stations device 10, 200, and 300, but the electronic device may be another electronic device that includes a heat-generating element.

Moreover, the multiple modifications described above may be implemented by combination as appropriate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat dissipation device comprising:
   a first plate with a first surface on which a first heat dissipation fin is formed;
   a second plate with a first surface on which a second heat dissipation fin is formed;
   a third plate with a first surface on which a third heat dissipation fin is formed;
   a fourth plate with a first surface on which a fourth heat dissipation fin is formed, and
   a heat conduction unit that passes through a first through-hole of the first plate, a second through-hole of the second plate, a third through-hole of the third plate and a fourth through-hole of the fourth plate, and wherein
   the heat conduction unit causes heat medium to pass through the first plate, the second plate adjacent to the first plate, the third plate adjacent to the second plate, the fourth plate adjacent to the third plate, and the first plate adjacent to the fourth plate, in this order.

2. The heat dissipation device according to claim 1, wherein
   a second surface of the first plate comes into contact with a heat source, and the heat conduction unit conducts heat of the first plate to the second plate.

3. The heat dissipation device according to claim 1, wherein
   the first through-hole is formed in a projection section that is formed in the first surface.

4. The heat dissipation device according to claim 1, wherein
   the heat conduction unit is a heat pipe in which heat medium flows.

5. The heat dissipation device according to claim 4, wherein
   the heat conduction unit conducts heat of the first plate to the second plate by receiving the heat from the first plate to evaporate the heat medium, and releasing the heat to the second plate to condense the heat medium.

6. The heat dissipation device according to claim 1, wherein,
   the first plate, the second plate, the third plate, and the fourth plate constitute a tubular housing, and
   lids are provided on axial both-end portions of the housing.

7. The heat dissipation device according to claim 6, further comprising:
   an inner tube disposed in the housing; and
   a fifth heat dissipation fin formed on an inner circumferential surface of the inner tube, wherein
   the heat conduction unit conducts heat of the first plate to the inner tube by causing heat medium to pass through the first plate and the inner tube.

8. The heat dissipation device according to claim 6, wherein,
   sealing members seal axial both-end portions of a hole that penetrates through the housing in an axial direction of the housing, to form a flow path through which heat medium circulates, in the hole, and
   the sealing members fix the lids to the housing.

9. The heat dissipation device according to claim 1, further comprising a tube body with axial both-end portions on which the first plate and the second plate are provided, wherein
   the first plate comes into contact with a heat source at an inner surface of the tube body, and
   the first plate and the second plate include the first and the second heat dissipation fins formed on outer surfaces of the tube body.

10. The heat dissipation device according to claim 1, wherein
    the heat conduction unit includes:

a first circulation section that is formed in the first plate, and causes heat medium to circulate in a direction orthogonal to a thickness direction of the first plate;

a second circulation section that is formed in the second plate, and causes the heat medium to circulate in a direction orthogonal to a thickness direction of the second plate; and a joining section that joins the first circulation section and the second circulation section to each other, and causes the heat medium to circulate in the outer side of the first plate and the second plate.

11. An electronic device comprising:

a housing including a first plate, a second plate, a third plate and a fourth plate;

a heat-generating element coming into contact with an inner surface of the housing in the first plate;

heat dissipation fins formed on an outer surface of the housing in the first plate, formed on an outer surface of the housing in the second plate, formed on an outer surface of the housing in the third plate, and formed on an outer surface of the housing in the fourth plate; and a heat conduction unit that conducts heat of the first plate to the second plate, the second plate to the third plate, the third plate to the fourth plate, and the fourth plate to the first plate by causing heat medium to pass through the first plate, the second plate, the third plate, and the fourth plate.

12. A base station device comprising:

a housing including a first plate, a second plate, a third plate and a fourth plate, and having an interior being sealed;

a circuit board coming into contact with an inner surface of the housing in the first plate;

heat dissipation fins formed on an outer surface of the housing in the first plate, formed on an outer surface of the housing in the second plate, formed on an outer surface of the housing in the third plate, and formed on an outer surface of the housing in the fourth plate; and a heat conduction unit that conducts heat of the first plate to the second plate, the second plate to the third plate, the third plate to the fourth plate, and the fourth plate to the first plate by causing heat medium to pass through the first plate, the second plate, the third plate, and the fourth plate.

\* \* \* \* \*